(12) United States Patent
Ogirko

(10) Patent No.: US 12,025,675 B2
(45) Date of Patent: Jul. 2, 2024

(54) SYSTEM AND METHOD FOR MEASURING BATTERY IMPEDANCE

(71) Applicant: Cypress Semiconductor Corporation, San Jose, CA (US)

(72) Inventor: Roman Ogirko, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 17/740,398

(22) Filed: May 10, 2022

(65) Prior Publication Data
US 2023/0366946 A1 Nov. 16, 2023

(51) Int. Cl.
*G01R 31/389* (2019.01)
*H02J 7/00* (2006.01)

(52) U.S. Cl.
CPC .......... *G01R 31/389* (2019.01); *H02J 7/0014* (2013.01); *H02J 7/0048* (2020.01)

(58) Field of Classification Search
None
See application file for complete search history.

(56) References Cited

U.S. PATENT DOCUMENTS

2021/0356525 A1\* 11/2021 Van Vroonhoven ........................ H01M 10/482

\* cited by examiner

*Primary Examiner* — Jas A Sanghera

(57) ABSTRACT

One or more circuits and/or methods are provided. In an example, a circuit includes a first sampling capacitor connected to a first battery terminal for connecting to a battery, an excitation circuit connected to the first battery terminal and configured to generate a first excitation signal, and a measurement circuit connected to the first sampling capacitor and configured to measure charge transferred to the first sampling capacitor by the first excitation signal to generate a charge transfer measurement and to determine a first impedance measurement across the first battery terminal and a second battery terminal for connecting to the battery based on the charge transfer measurement.

18 Claims, 15 Drawing Sheets

SYSTEM AND METHOD FOR MEASURING BATTERY IMPEDANCE

BACKGROUND

Batteries are used to provide power to many items, such as computing devices, vehicles, Internet of Things (IoT) devices, communications devices, facilities, and other devices. Battery management systems monitor batteries to determine parameters such as remaining charge, battery health, or other parameters.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

An embodiment of the presently disclosed techniques includes a circuit. The circuit includes a first sampling capacitor connected to a first battery terminal for connecting to a battery, an excitation circuit connected to the first battery terminal and configured to generate a first excitation signal, and a measurement circuit connected to the first sampling capacitor and configured to measure charge transferred to the first sampling capacitor from the first excitation signal to generate a charge transfer measurement and to determine a first impedance measurement across the first battery terminal and a second battery terminal for connecting to the battery based on the charge transfer measurement.

An embodiment of the presently disclosed techniques includes an apparatus. The apparatus includes means for connecting a first sampling capacitor to a first battery terminal for connecting to a battery, means for generating a first excitation signal on the first battery terminal, means for measuring charge transferred to the first sampling capacitor from the first excitation signal to generate a charge transfer measurement, and means for determining a first impedance measurement across the first battery terminal and a second battery terminal for connecting to the battery based on the charge transfer measurement.

An embodiment of the presently disclosed techniques includes a method. The method includes connecting a first sampling capacitor to a first battery terminal for connecting to a battery, generating a first excitation signal on the first battery terminal, measuring charge transferred to the first sampling capacitor from the first excitation signal to generate a charge transfer measurement, and determining a first impedance measurement across the first battery terminal and a second battery terminal for connecting to the battery based on the charge transfer measurement.

An embodiment of the presently disclosed techniques includes a circuit. The circuit includes a first sampling capacitor, a second sampling capacitor, a measurement circuit, switch circuitry connecting the measurement circuit to the first sampling capacitor responsive to a load frequency being greater than a first value and connecting the measurement circuit to the second sampling capacitor responsive to the load frequency being less than the first value, and multiplexing circuitry selectively connecting one of the first sampling capacitor or the second sampling capacitor to one of a first battery terminal for connecting to a first cell of a battery or a second battery terminal for connecting to a second cell of the battery, wherein the measurement circuit is configured to measure an impedance across the one of the first battery terminal or the second battery terminal selected by the multiplexing circuitry and a reference battery terminal.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DETAILED DESCRIPTION

Figure 1:
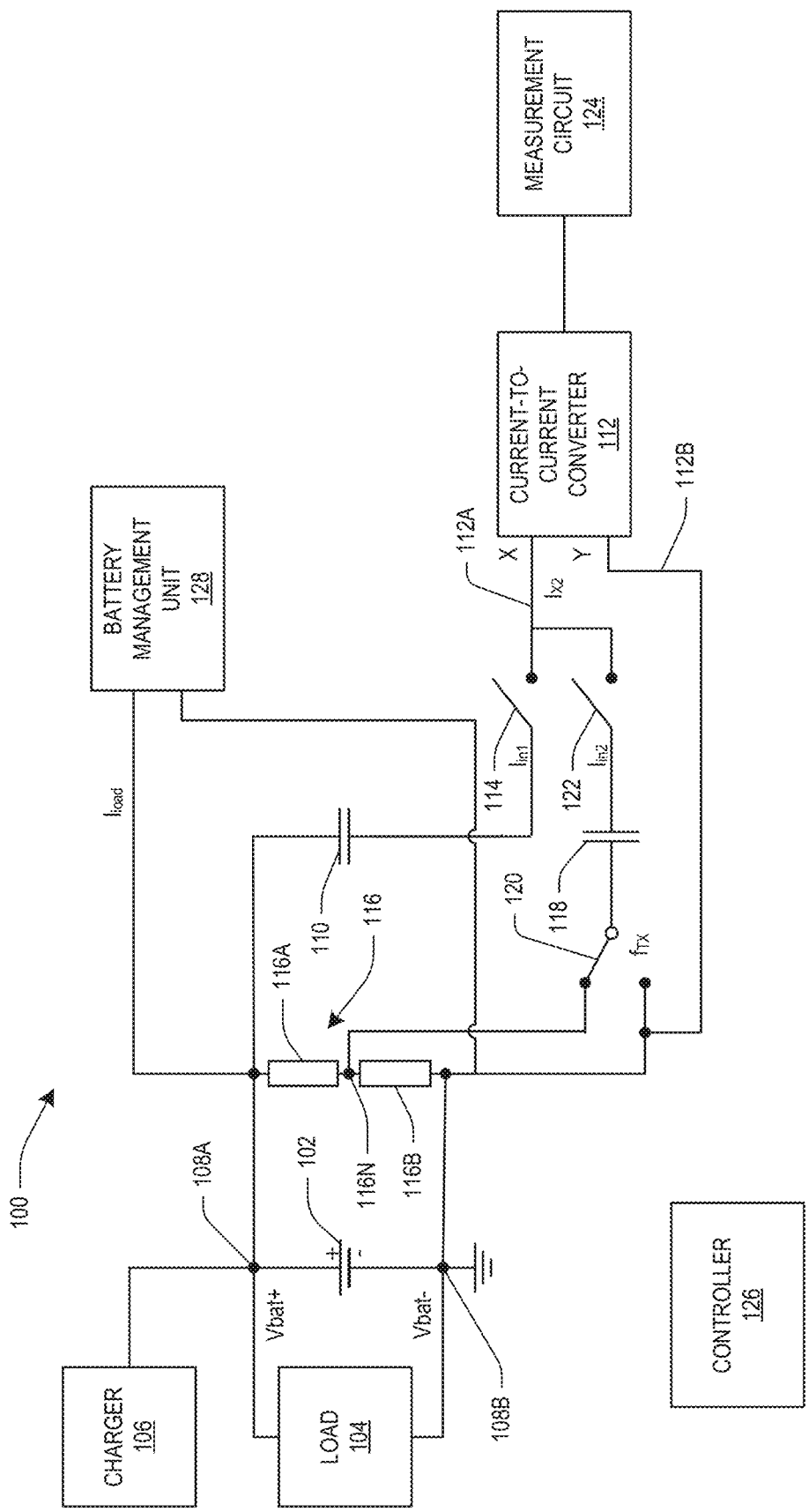
FIG. 1 is a diagram illustrating a circuit for measuring impedance of a battery, in accordance with some embodiments.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

It is to be understood that the following description of embodiments is not to be taken in a limiting sense. The scope of the present disclosure is not intended to be limited by the embodiments described hereinafter or by the drawings, which are taken to be illustrative only. The drawings are to be regarded as being schematic representations and elements illustrated in the drawings are not necessarily shown to scale. Rather, the various elements are represented such that their function and general purpose become apparent to a person skilled in the art.

All numerical values within the detailed description and the claims herein are modified by "about" or "approximately" the indicated value, and take into account experimental error and variations that would be expected by a person having ordinary skill in the art.

FIG. 1 is a diagram illustrating a circuit 100 for measuring impedance of a battery 102, in accordance with some embodiments. The battery impedance comprises a resistive component and a reactive component. The battery impedance may be expressed as a complex number, where the resistive component of the battery impedance is represented by a real component of the complex number and the reactive component of the battery impedance is represented by an imaginary component of the complex number. In some embodiments, the battery 102 powers a load 104 and a charger 106 may be periodically connected to the battery 102 for charging the battery 102. The circuit 100 comprises a first battery terminal 108A (Vbat+) and a second battery terminal 108B (Vbat−) connected to the battery 102. A first sampling capacitor 110 is connected between the first battery terminal 108A and a current-to-current converter 112 through a switch 114. A voltage divider 116 including resistors 116A, 116B is connected across the battery terminals 108A, 108B. A second sampling capacitor 118 is connected to a switch 120 that selectively connects the second sampling capacitor 118 to the voltage divider 116 at a node 116N between the resistors 116A, 116B or to the second battery terminal 108B. The second sampling capacitor 118 is connected to the current-to-current converter 112 by a switch 122. A measurement circuit 124 is connected to the current-to-current converter 112 and a controller 126 controls the switches 114, 120, 122 to select one of the sampling capacitors 110, 118 to connect to the current-to-current converter 112 and the measurement circuit 124 for measuring battery impedance. A battery management unit 128 is connected to the battery terminals 108A, 108B. In some embodiments, the battery management unit 128 measures load current on the battery 102, generates signals for balancing the battery 102 in the case where the battery 102 comprises multiple cells, and generate an excitation signal for measuring battery impedance. Other structures and configurations of the circuit 100 are within the scope of the present disclosure.

In some embodiments, the controller 126 selects one of the sampling capacitors 110, 118 for measuring battery impedance depending on the operating frequency of the battery management unit 128. The first sampling capacitor 110 is used to measure battery impedance according to a charge transfer mode using an excitation signal generated by the battery management unit 128. The second sampling capacitor 118 is used to measure battery impedance according to a voltage measurement mode using an excitation signal generated by the battery management unit 128 and toggling the switch 120 between the node 116N of the voltage divider 116 and the second battery terminal 108B to sample the battery voltage. In some embodiments, the charge transfer mode is selected for system frequencies greater than 100 Hz, and the voltage measurement mode is selected for system frequencies less than or equal to 100 Hz.

Figure 2:
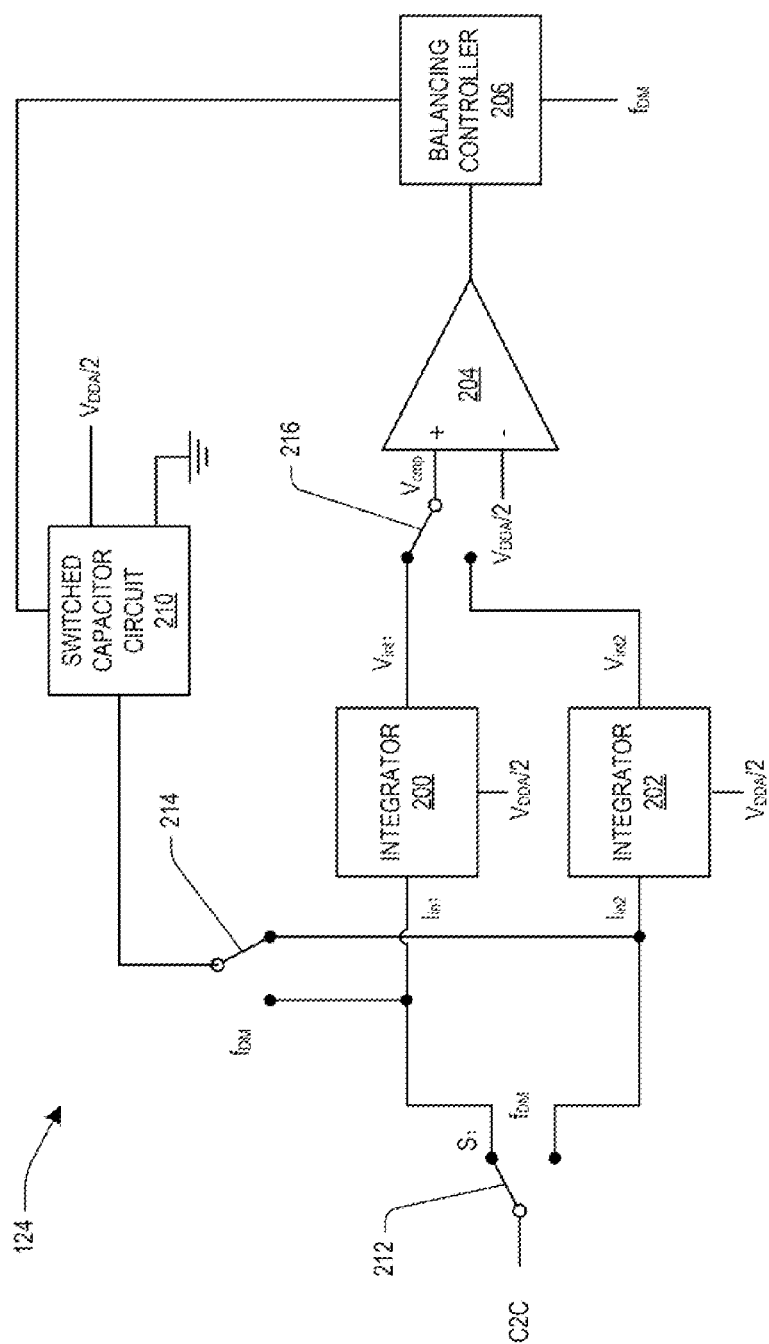
FIG. 2, is a diagram of a measurement circuit, in accordance with some embodiments.

FIG. 2, is a diagram of the measurement circuit 124, in accordance with some embodiments. In some embodiments, the measurement circuit 124 comprises a first integrator 200, a second integrator 202, a comparator 204, a balancing controller 206, and a switched-capacitor circuit 210. A switch 212 selectively connects the output, C2C, from the current-to-current converter 112 to the input of the first integrator 200 or the second integrator 202, and a switch 214 selectively connects the switched-capacitor circuit 210 to the input of the first integrator 200 or the second integrator 202. In some embodiments, the switches 212, 214, 216 operate synchronously. When the switch 212 connects the C2C output (scaled input signal) to one of the integrators 200, 202, the switch 214 connects the switched-capacitor circuit 210 to the input of other integrator 200, 202 for balancing by connecting the output of the integrator 200, 202 through the switch 216 to the input of the comparator 204. In some embodiments, the balancing controller 206 injects balancing pulses using the switched capacitor circuit 210 into the input of the first integrator 200 when the second integrator 202 is connected to the C2C output by the switch 212. The balancing controller 206 injects balancing pulses using the switched capacitor circuit 210 into the input of the second integrator 202 when the first integrator 200 is connected to the C2C output by the switch 212. The balancing pulses are evident in the Vint1 and Vint2 waveforms shown in FIG. 4. The balancing controller 206 continues the integrator balancing until the comparator 204 changes state.

In the voltage measurement mode, the switches 212, 214, 216 operate in phase with the switch 120 at a high sampling frequency to sample the battery voltage. In the charge transfer mode, when a battery voltage ripple caused by the load current of the battery 102 resulting from an excitation signal generated by the battery management unit 128 is applied to C2C through the first sampling capacitor 110, the switches 212, 214, 216 operate in phase with the load current to measure the resistive component of the battery impedance and with a 90° shift respectively to the load current phase to measure the reactive component of the battery impedance. This resulting converting of the input signal to code is formed in the counter 208 as a sum of the balancing pulses formed by the switched-capacitor circuit 210 for the balancing of the first integrator 200 and the second integrator 202. The switches 212, 214 are controlled by a measurement switching signal, $f_{DM}$, so that when one of the first integrator 200 or the second integrator 202 is connected to the current-to-current converter 112, the other of the first integrator 200 or the second integrator 202 is connected to the switched-capacitor circuit 210. Thus, the first integrator 200 and the second integrator 202 are connected to the current-to-current converter 112 at intervals 90° out of phase with respect to one another.

Figure 3:
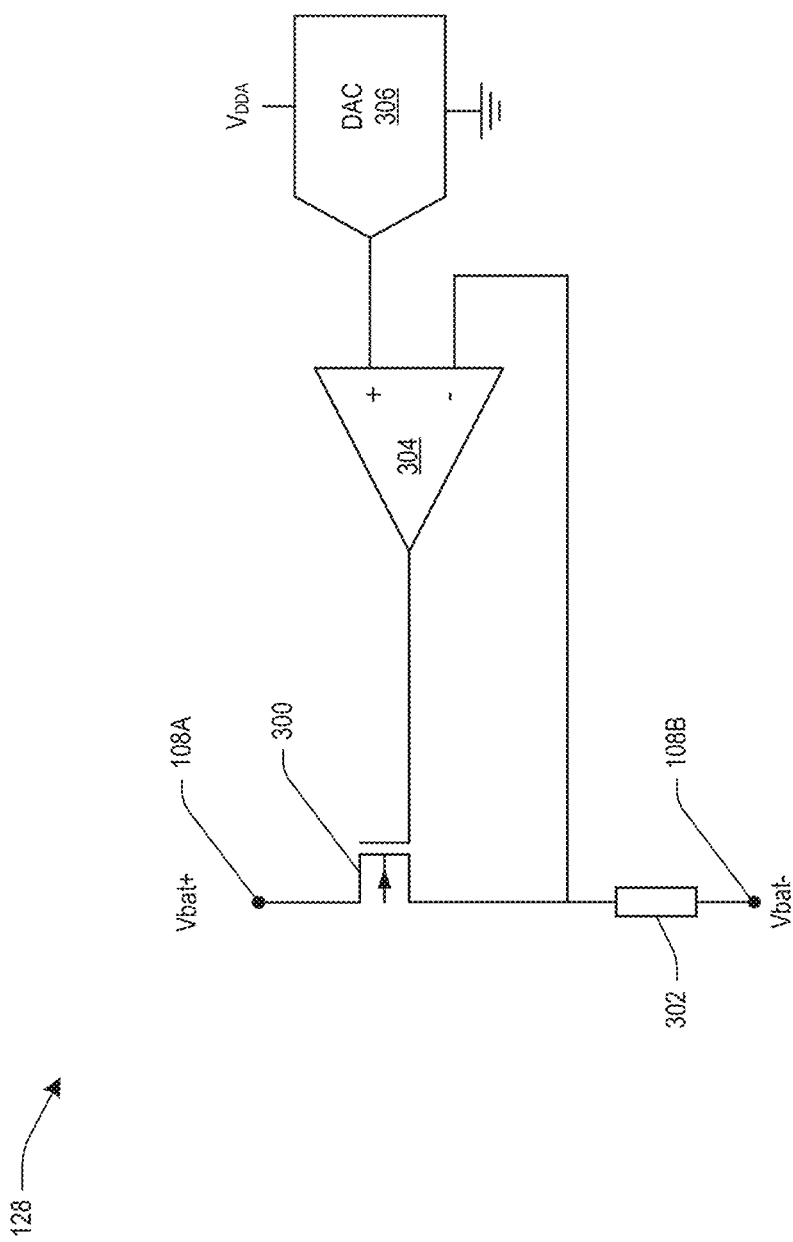
FIG. 3 is a diagram of a battery management unit, in accordance with some embodiments.

FIG. 3 is a diagram of the battery management unit 128, in accordance with some embodiments. In some embodiments, the battery management unit 128 includes a transistor 300, a shunt resistor 302, an operational amplifier 304, and a digital-to-analog converter (DAC) 306. The transistor 300 and the shunt resistor 302 are connected in series and across the terminals 108A, 108B of the battery 102. The operational amplifier 304 maintains the voltage drop across the shunt resistor 302 equal to the voltage at its non-inverting input supplied from the output of the DAC 306, by generating a gate voltage of the transistor 300. Current from the battery 102 passes through the transistor 300 and the shunt resistor 302. The DAC 306 performs a current regulation function based on the equation:

$$I_{load} = V\_DAC/Rsh, \quad (1)$$

where the load current, Iload is equal to the output voltage of the DAC 305, V_DAC, divided by the resistance, Rsh, of the shunt resistor 302. The DC component of the voltage generated by the DAC 306 sets the load current for battery balancing, if necessary.

Figure 4:
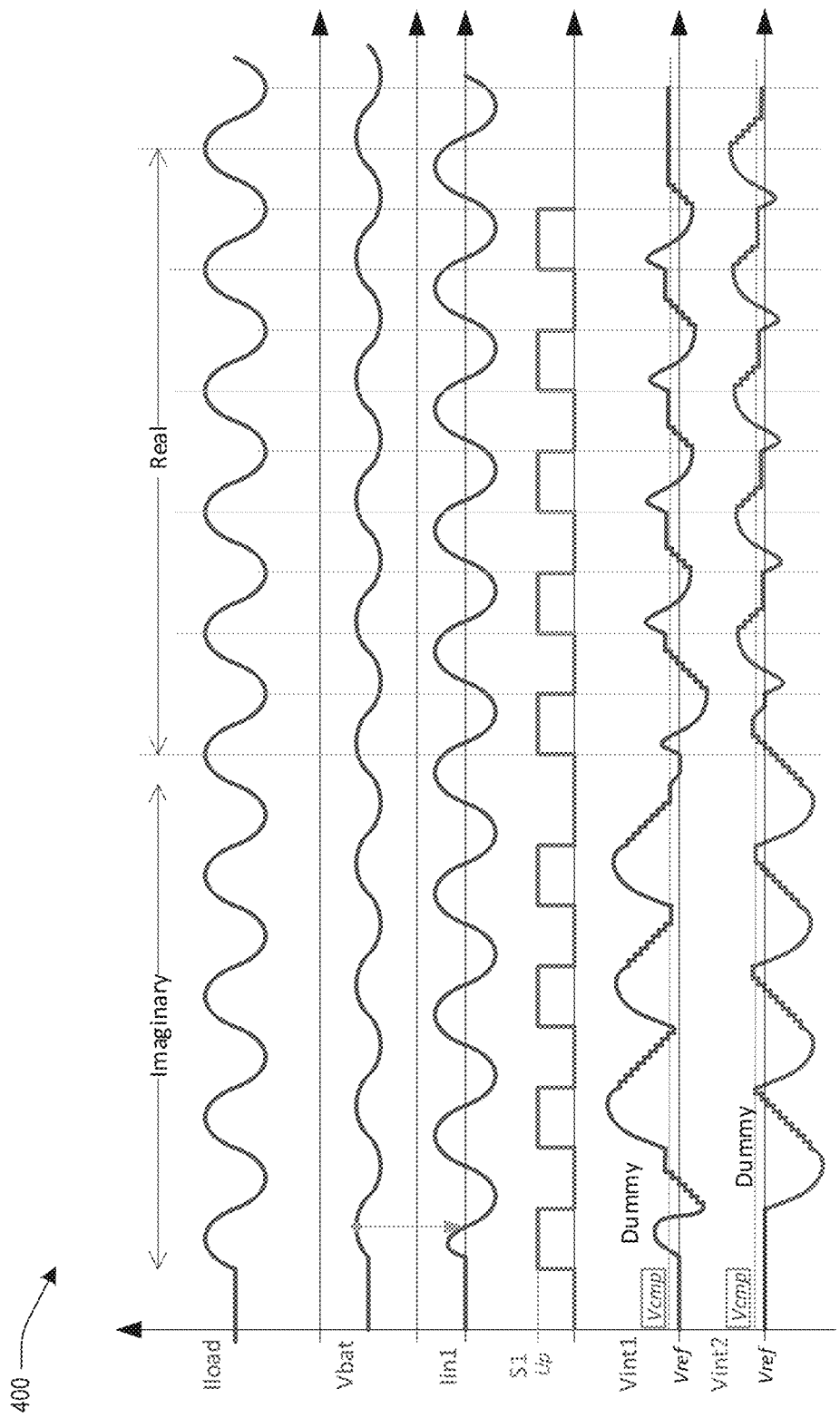
FIG. 4 is a diagram illustrating waveforms present in a measurement circuit during operation in a charge transfer mode, in accordance with some embodiments.

FIG. 4 is a diagram 400 illustrating the waveforms present in the measurement circuit 124 during operation in the charge transfer mode, in accordance with some embodiments. The waveforms shown in FIG. 4 are:

$I_{load}$—Load current measured by the battery management unit 128;

Vbat—Voltage of the battery 102;

Iin1—Current passing through the first sampling capacitor 110 to the current-to-current converter;

S1—Switching signal applied to the switch 212;

Vint1—Output voltage of the first integrator 200; and

Vint2—Output voltage of the second integrator 202.

In the charge transfer mode, an AC component of the voltage generated by the DAC 306 provides an excitation signal for measuring battery impedance using the first sampling capacitor 110. The charge transfer mode may be selected in cases where the frequency of the AC component generated by the DAC 306 is greater than 100 Hz.

In the charge transfer mode, the switch 114 is closed and the switch 122 is open. The AC component of the voltage generated by the DAC 306 generates a ripple on the DC component. The magnitude of this ripple is:

$$\overrightarrow{Vbat_{ac(t)}} = Vex \cdot \sin(2 \cdot \pi \cdot Fsine \cdot t) \cdot \frac{\overrightarrow{Zbat(Fsine)}}{Rsh} \quad (1)$$

where Vex is the magnitude of the AC excitation voltage, F sine, is the frequency of the excitation signal, and Zbat is the battery impedance vector comprising a resistive component and a reactive component.

The ripple generates alternating current through the first sampling capacitor 110 to the X input of the current-to-current converter 112 via a high current wire 112A. The Y-input of the current-to-current convertor is high-impedance and is connected to the battery terminal 108B by a separate wire 112B to eliminate voltage on the high-current wire 112A caused by the excitation current.

The switches 212, 214, 216 are controlled by the switching signal, $f_{DM}$, which operates in-phase with the excitation signal, F sin, generated by the DAC 305 to measure the resistive component of the impedance and is phase shifted by 90° to the excitation signal to measure the reactive component of the impedance. The integrator voltage at the end of an integration period is:

$$Vint_{re} = \frac{2 \cdot Vex \cdot Zbat_{re}(Fsin) \cdot Csmp1 \cdot Att}{Rsh \cdot Cint} \text{ and} \quad (2)$$

$$Vint_{im} = \frac{2 \cdot Vex \cdot Zbat_{im}(Fsin) \cdot Csmp1 \cdot Att}{Rsh \cdot Cint}$$

where $Vint_{re}$ represents the voltage of the first integrator 200, $Vint_{im}$ represents the voltage of the second integrator 202, Cint is the integrator capacitance, and Att is the gain of the current-to-current converter 112.

When one of the integrators 200, 202 collects the charge transferred through the first sampling capacitor 110 (scaled by the Att factor) during a half-period of excitation, the charge collected in the other integrator 200, 202 during the previous half-period of the excitation is balanced with the switched-capacitor circuit 210 by a portion of the charge:

Qref=Cref·Vref, where Vref=Vint1 or Vint2.

The result of the balancing is:

$$Vint = Nx \cdot Vref \cdot \frac{Cref}{Cint} \quad (3)$$

where Nx is the number of balancing pulses of the charge generated by the switched capacitor circuit 210 at a high frequency, such as the system clock frequency, Cref is the capacitance value of the switched capacitor circuit 210, and Vref is the reference voltage.

As follows, one conversion result is:

$$Nx = \text{round}\left(\frac{Vint \cdot Cint}{Vref \cdot Cref}\right) = \text{round}\left(\frac{2 \cdot Vex \cdot Zbat_{xx}(Fsin) \cdot Csmp1 \cdot Att}{Rsh \cdot Vref \cdot Cref}\right), \quad (5)$$

where $Zbat_{xx}$ is the battery impedance (resistive or reactive component) depending on the phase of $f_{dm}$ signal.

If the excitation voltage is generated by scaling the reference voltage with DAC Vex=k·Vref, the accuracy of the reference voltage does not affect the impedance measurement result because Vex and Vref are in the numerator and denominator and Vref is the source of Vex.

The conversion sequence can be repeated M times without resetting the capacitors of the integrators 200, 202. As a result, the quantization error remains in the integrator 200, 202 and is added to charge of next conversion. In this manner, the quantization error is accumulated and the conversion resolution is increased proportionally to number of conversions used for measurement. The measurement result after conversion of M periods of excitation is:

$$Nxm_{xx} = \text{round}\left(M \cdot \frac{2 \cdot Vex \cdot Zbat_{xx}(Fsin) \cdot Csmp1 \cdot Att}{Rsh \cdot Vref \cdot Cref}\right) \quad (4)$$

The impedance is calculated using the conversion result, and known values of the excitation voltage and the shunt resistor:

$$Z_{xx} = \quad (5)$$

$$Kadc \cdot \frac{Nxm_{xx}}{Vex} \cdot Rsh \cong Kadc \cdot \text{round}\left(M \cdot \frac{2 \cdot Zbat_{xx}(Fsin) \cdot Csmp1 \cdot Att}{Vref \cdot Cref}\right),$$

where $Z_{xx}$ is the measured impedance resistive or reactive component depending on the phase of $f_{DM}$ signal, Kadc is the coefficient to convert the numeric output $Nxm_{xx}$ to voltage.

The integrator balancing stops after the comparator 204 changes state. Thus, at the end of balancing, the quantization error remains in the integrator and also the comparator offset. To address the quantization error, a series of dummy conversions are performed before taking the impedance measurement to allow accumulation of the quantization error in the integrators 200, 202 so that the integrators 200, 202 include the comparator offset as the starting point of the measurement, and the comparator offset does not affect the measurement result.

As seen in FIG. 4, the Vint1 and Vint2 waveforms show a number of balancing pulses of reference charge during a dummy time period, where the balancing pulses are provided for both polarities of the input signal. Even with a significant comparator offset, Vcmp, and different polarities of the incoming signal, the final results of accumulation for both polarities is the same, which demonstrates insensitivity of measurement results to the offset of the integrators 200, 202 and the comparator 204.

The impedance measurement in the charge transfer mode using the sampling capacitor 110 as a decupling capacitor to eliminate the battery voltage is functional for conditions that include a high frequency signal for the DAC 306. However, when the impedance is measured at a low frequency (such as less than 100 Hz), the measurement circuit 124 operates in a voltage measurement mode, where the battery impedance is calculated as the ratio of the AC component of the battery voltage to value of the AC current that loads the battery 102 using battery voltage samples collected during the measurement period.

Figure 5:
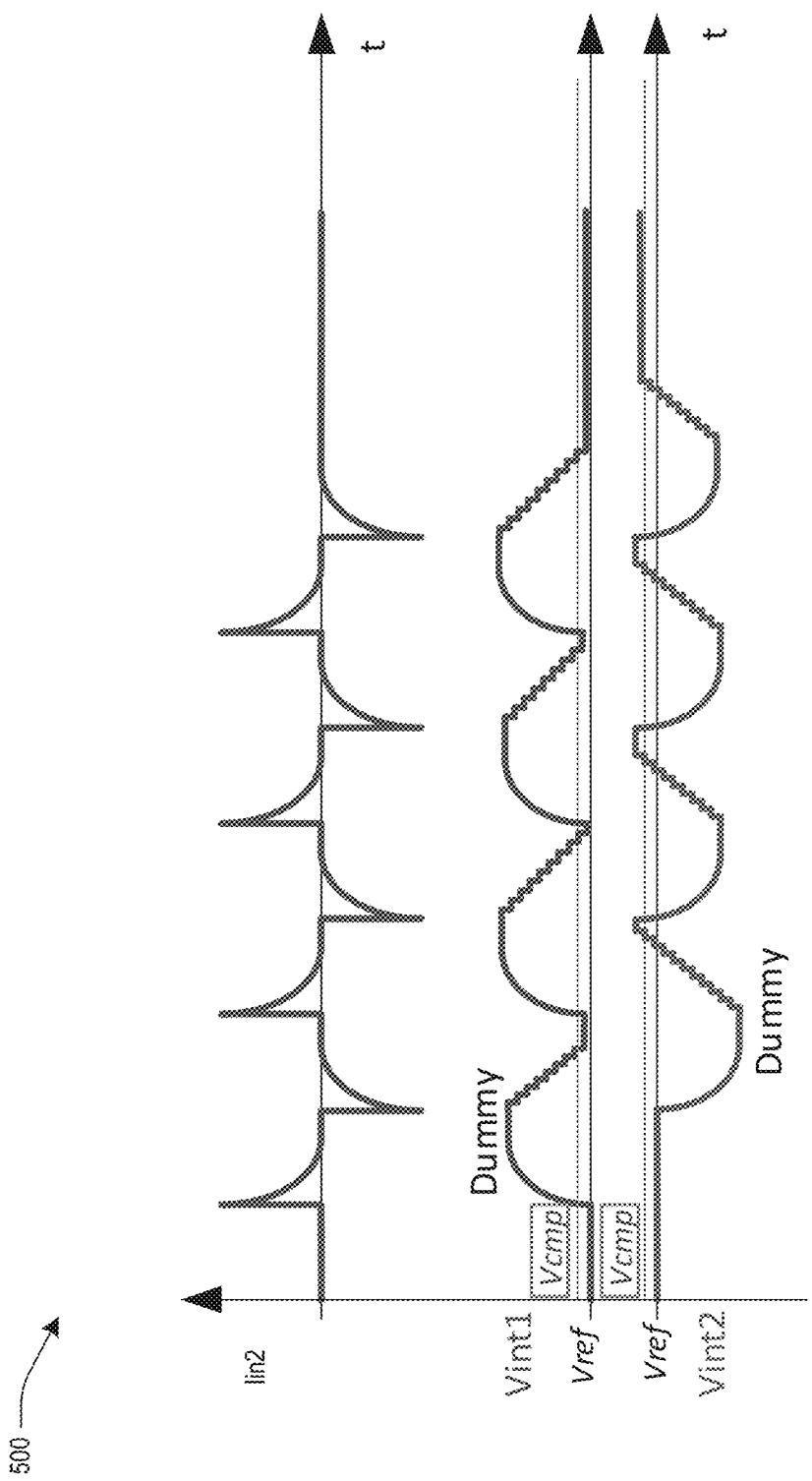
FIGS. 5 and 6 are diagrams illustrating waveforms present in a measurement circuit during operation in a voltage measurement mode, in accordance with some embodiments.
Figure 6:
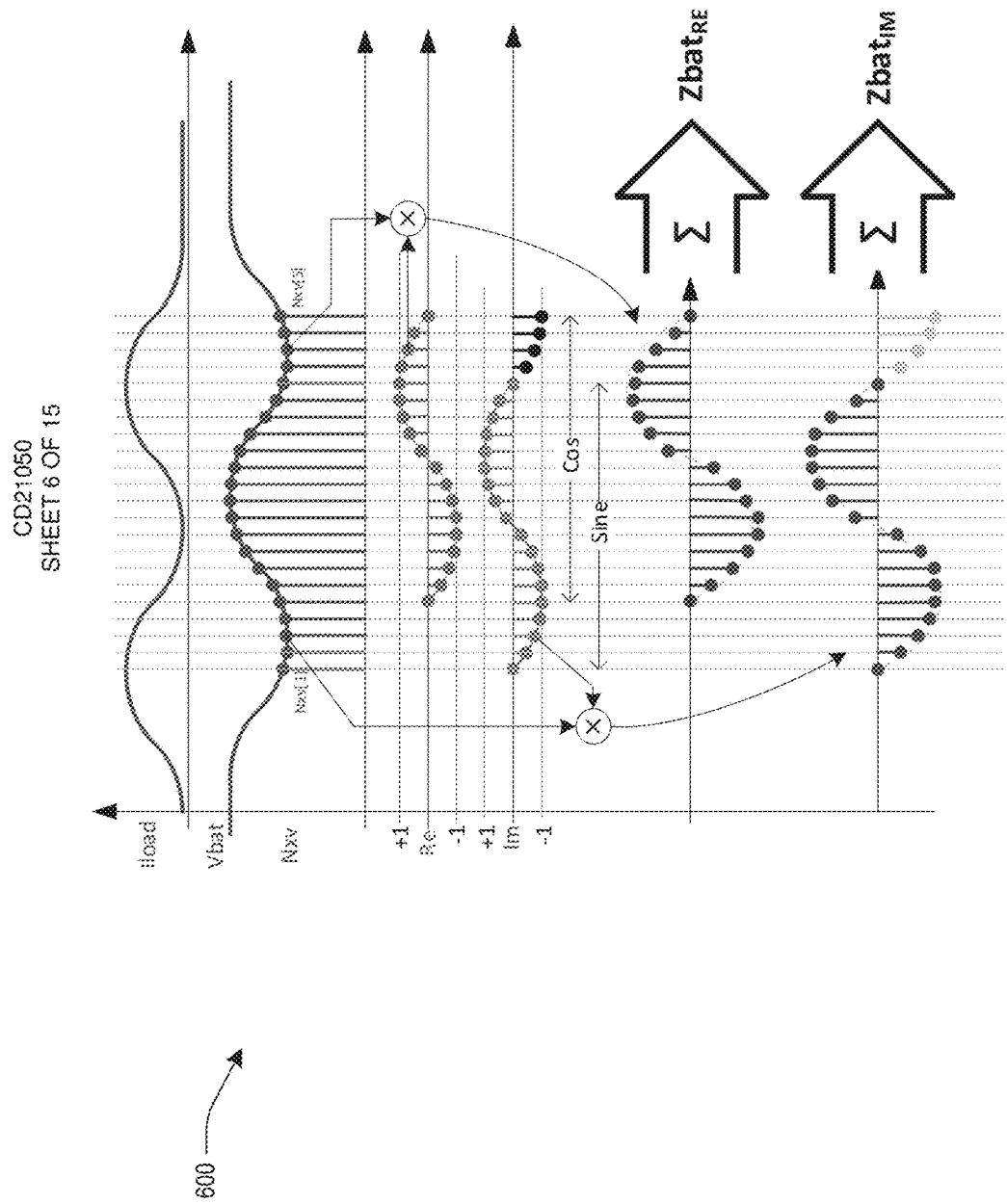

FIGS. 5 and 6 are diagrams 500, 600 illustrating the waveforms present in the measurement circuit 124 during operation in the voltage measurement mode, in accordance with some embodiments. The waveforms shown in FIGS. 5 and 6 are:

Iin2—Current passing through the second sampling capacitor 118 to the current-to-current converter;
Vint1—Output voltage of the first integrator 200;
Vint2—Output voltage of the second integrator 202;
$I_{load}$—Load current measured by the battery management unit 128;
Vbat—Voltage of the battery 102;
Nxv—Number of balancing pulses;
Re—Resistive component correlation waveform; and
Im—Reactive component correlation waveform.

In the voltage measurement mode, the switch 114 is open, and the switch 122 is closed to connect the second sampling capacitor 118 to the measurement circuit 124 via the current-to-current converter 112. The battery voltage is used to generate an excitation signal for the second sampling capacitor 118 by toggling the switch 120 between the node 116N of the voltage divider 116 and the second battery terminal 108B. The voltage divider 116 is employed in embodiments where the battery voltage exceeds a rating of the switch 120. In some embodiments, the voltage divider 116 is omitted if the battery voltage does not exceed the rating of the switch 120. The switch 120 is controlled according to a switching signal, $f_{TX}$. The switching signal, $f_{TX}$, operates in-phase with the switches 212, 214 in the measurement circuit 124 ($f_{TX}=f_{DM}$).

The switching of the second sampling capacitor 118 between the node 116N and the second battery terminal 108B, or between the battery terminals 108A, 108B if the voltage divider 116 is omitted, generates current pulses in the X-input of the current-to-current converter 112 ($I_{in2}$). The $I_{in2}$ current, after scaling, is integrated by one of integrators 200, 202 respectively to the half-period of the excitation signal, represented by $V_{int1}$ and $V_{int2}$). The integrator voltage at the end of integration period is:

$$V\text{int}_v = \frac{Vbat \cdot Csmp2 \cdot Att}{Cint}. \quad (6)$$

In accordance with the balancing in Equation (4) the number of balancing pulses is:

$$Nxv = \text{round}\left(\frac{V\text{int} \cdot Cint}{Vref \cdot Cref}\right) = \text{round}\left(\frac{Vbat \cdot Csmp2 \cdot Att}{Vref \cdot Cref}\right). \quad (7)$$

The accumulation of the conversion of M TX pulses results in:

$$Nxv = \text{round}\left(M \cdot \frac{Vbat \cdot Csmp2 \cdot Att}{Vref \cdot Cref}\right). \quad (8)$$

The battery voltage is:

$$Vbat = \frac{Vref \cdot Cref}{M \cdot Csmp2 \cdot Att} \cdot Nxv_M. \quad (11)$$

An example of the battery voltage conversion is illustrated using the conditions:
Vbat=4V;
$f_{TX}$=200 kHz;
Fc/k=50 MHz (balancing clock frequency);
second sampling capacitor 118 capacitance=1 pF;
Cint=2 pF; and
Vref=1.2V.

The attenuation, Att, is set to a value that provides that the voltage swing in the integrators 200, 202 is inside the dynamic range of the integrators 200, 202. For example, if the dynamic range of the integrators 200, 202 is Vint_max=±1 V for positive and negative input current, the attenuation can be calculated as:

$$Att = \frac{V\text{int\_max}}{Vbat} \cdot \frac{Cint}{Csmp2} = \frac{1 \text{ V}}{4 \text{ V}} \cdot \frac{2 \text{ pF}}{1 \text{ pF}} = \frac{1}{2}. \quad (9)$$

Assume the balancing time for maximal battery voltage, Vbat, is 0.8 of the $f_{TX}$ half-period duration with a 20% margin for overload. During the balancing time, the charge collected in the integrators 200, 202 is balanced. To provide balancing conditions:

$$Cref = \frac{Vbat \cdot Csmp2 \cdot Att}{Vref} \cdot \frac{0.8 \cdot 2 \cdot Ftx}{Fclk} = \quad (10)$$

$$\frac{4 \text{ V} \cdot 1 \text{ pF}}{1.2 \text{ V}} \cdot \frac{1}{2} \cdot \frac{0.8 \cdot 2 \cdot 200 \text{ kHz}}{50000 \text{ kHz}} = 10.6 fF.$$

The resolution after M conversion accumulation is:

$$Nxv_{v_{max}} = M \cdot \frac{Fclk}{0.8 \cdot Ftx} = M \cdot \frac{50000 \text{ kHz}}{0.8 \cdot 200 \text{ kHz}} = 312 \cdot M. \quad (11)$$

Thereby accumulation of 10 conversions gives ≈12 bit@20 ksps, and for 100 conversions, accumulation ≈15 bit@2 ksps. These conversions are sufficient to measure the battery voltage ripple at frequencies less than 100 Hz. An example of 32,100 counts for a 4V measuring range provides 128 uV resolution, which corresponds to 128µΩ resolution for a 1A load current.

In the voltage measurement mode, if the conversion occurs sequentially, the conversion results form a data stream with a period Tsmp equal to the conversion time. The result of the conversion is proportional to the average value of the input signal during the sampling period. Therefore, it is reasonable to consider the processing of the conversion data in the discrete time domain relative to the data sampling.

The battery load current in discrete time domain is:

$$I_{load}[n] = Vex \cdot \sin(2 \cdot \pi \cdot F \sin \cdot Tsmp \cdot n)/Rsh \qquad (12)$$

where n is the sample number in a discrete sequence representing the signal, F sin is the excitation frequency, and Tsmp is the battery sampling period.

The battery voltage is considered to be the composition of the battery voltage at rest $Vbat_{DC}$, the voltage drop caused by the average excitation current, and the voltage drop caused by the variable excitation component. According to these assumptions, the battery voltage is:

$$Vbat[n] = Vbat_{DC} - Vex \cdot \frac{Zbat_{DC}}{Rsh} + Iload[n] \cdot \overrightarrow{Zbat(F\sin)} == Vbat_{DC} - \qquad (13)$$

$$Vex \cdot \frac{Zbat_{DC}}{Rsh} + \frac{Vex \cdot (Zbat_{RE}(F\sin) \cdot \sin(2 \cdot \pi \cdot F\sin \cdot Tsmp \cdot n) + Zbat_{IM}(F\sin) \cdot \cos(2 \cdot \pi \cdot F\sin \cdot Tsmp \cdot n))}{Rsh}.$$

where $Zbat_{RE}$ and $Zbat_{IM}$ are the resistive and reactive components of the battery impedance at the frequency F sin, $Vbat_{DC}$ is the battery voltage without load, and Vex is the excitation voltage for the load current regulator of the battery management unit 128.

The resistive component of the impedance responds to the excitation in-phase with the signal of sinusoidal excitation, and the reactive component of the impedance reacts with a phase shift of 90° or in proportion to the cos.

Correlation of the samples data with the values of sine and cosine by multiplying the voltage samples by sine/cosine in phase with the excitation with subsequent accumulation allows determination of the impedance components, as shown in FIG. 6. The correlation for the components of Equation 16 gives the following results:

$$\sum_{n=k}^{k+v} \left( Vbat_{DC} - Vex \cdot \frac{Zbat_{DC}}{Rsh} \right) \cdot \sin(2 \cdot \pi \cdot F\sin \cdot Tsmp \cdot n) = 0, \qquad (14)$$

$$\sum_{n=k}^{k+v} \left( Vbat_{DC} - Vex \cdot \frac{Zbat_{DC}}{Rsh} \right) \cdot \cos(2 \cdot \pi \cdot F\sin \cdot Tsmp \cdot n) = 0, \qquad (15)$$

$$\sum_{n=k}^{k+v} (\sin(2 \cdot \pi \cdot F\sin \cdot Tsmp \cdot n) \cdot \cos(2 \cdot \pi \cdot F\sin \cdot Tsmp \cdot n)) = 0, \qquad (16)$$

$$\sum_{n=k}^{k+v} \left( Vex \cdot Zbat_{RE}(F\sin) \cdot \frac{\sin(2 \cdot \pi \cdot F\sin \cdot Tsmp \cdot n)^2}{Rsh} \right) = \qquad (17)$$

$$\frac{v}{2} \cdot \frac{Vex}{Rsh} \cdot Zbat_{RE}(F\sin) = V_{RE}, \text{ and}$$

$$\sum_{n=k}^{k+v} \left( Vex \cdot Zbat_{IM}(F\sin) \cdot \frac{\cos(2 \cdot \pi \cdot F\sin \cdot Tsmp \cdot n)^2}{Rsh} \right) = \qquad (18)$$

$$\frac{v}{2} \cdot \frac{Vex}{Rsh} \cdot Zbat_{IM}(F\sin) = V_{IM}.$$

where k is the sample number when $\sin(2 \cdot \pi \cdot F \sin \cdot Tsmp \cdot n)=0$, and v is the number of samples in one period of the excitation signal. Correlation with sin and cos gives the values of $V_{RE}$ and $V_{IM}$, which are proportional to the resistive and reactive components of the battery impedance.

In some embodiments, correlation is provided using values of cos, starting with a 90° shift in time, which corresponds to 90° shifted sine seen in FIG. 6 as the Im waveform. This approach provides a windowing function.

In some embodiments, the voltage measurement mode is used without an excitation signal from the DAC 306 to assess parameters of the battery 102 such as battery state of charge or battery balancing if the battery 102 comprises a stack of cells.

Figure 7:
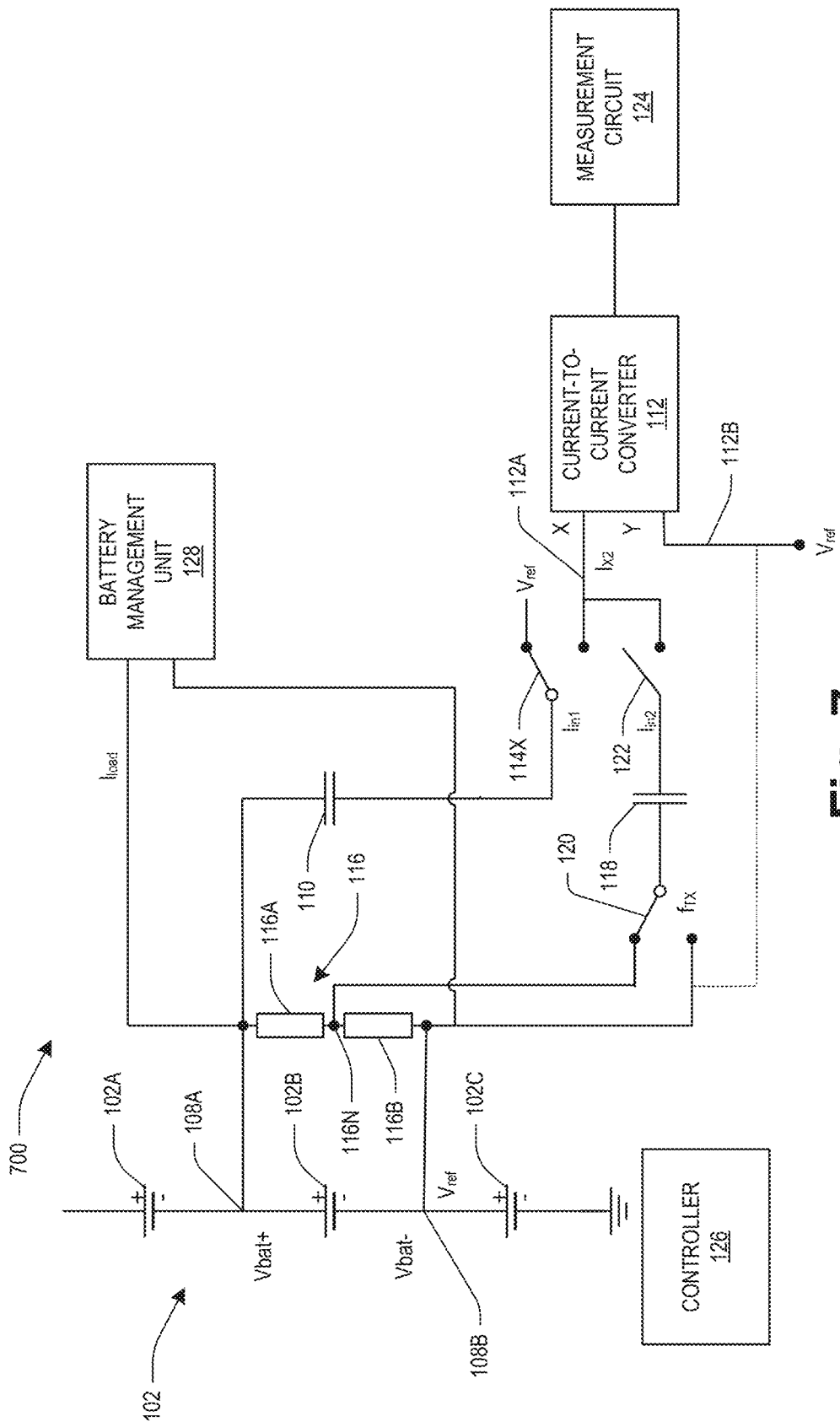
FIG. 7 is a diagram illustrating a circuit for measuring impedance of a battery comprising a stack of cells, in accordance with some embodiments.

FIG. 7 is a diagram illustrating a circuit 700 for measuring impedance of a battery 102 comprising a stack of cells 102A, 102B, 102C, in accordance with some embodiments. For ease of illustration, the load 104 and the charger 106 illustrated in FIG. 1 are omitted. As shown in FIG. 7, the circuit 100 is connected to the cell 102B, so the battery terminal 108B is not connected to ground but rather to the positive terminal of the cell 102C, designated as $V_{ref}$. In some embodiments, the circuit 100 is duplicated for each of the cells 102A, 102B, 102C. A switch 114X connects the first sampling capacitor 110 and the current-to-current converter 112 during a measurement, and connected the first sampling capacitor 110 to $V_{ref}$ when a measurement is not being conducted. The circuit 700 operates as described for the circuit 100 of FIG. 1, with the exception of the inputs to the current-to-current converter 112. The switch 114X connects the first sampling capacitor 110 to the X-input of the current-to-current converter 112 and the Y-input of the current-to-current converter 112 is connected to a reference voltage, $V_{ref}$, to separate the cell voltage ripple Vbat_ac from the common-mode voltage. In one configuration, the reference voltage, $V_{ref}$, corresponds to the positive voltage of the cell 102C. The conversion path may be low voltage or powered from $V_{DDA}$ supply and the high voltage wire. However, if the voltage of the cell 102C below the measured cell 102B changes for any reason, the impedance measurements may be distorted. In another configuration, the Y-input of the current-to-current converter 112 is directly connected to the negative terminal 108B of the cell 102B, as indicated by the dashed line, and the input stage of the current-to-current converter 112 operates under a common-mode voltage and must be HV and the wire 112B is a high voltage wire. However, in this configuration the measurements are not sensitive to fluctuation of the common-mode voltage. This configuration allows the battery impedance for each cell 102A, 102B, 102C to be measured simultaneously (in parallel).

The switch 114X connects the first sampling capacitor 110 to the reference voltage, $V_{ref}$, to maintain a constant DC voltage on the first sampling capacitor 110 when measuring the cell voltage using the second sampling capacitor 118 with the switch 122 closed. When switching to the charge transfer mode with the switch 122 open and the switch 114X connected to the X-input of the current-to-current converter 112, the second sampling capacitor 118 is not charged and no parasitic current is generated.

Figure 8:
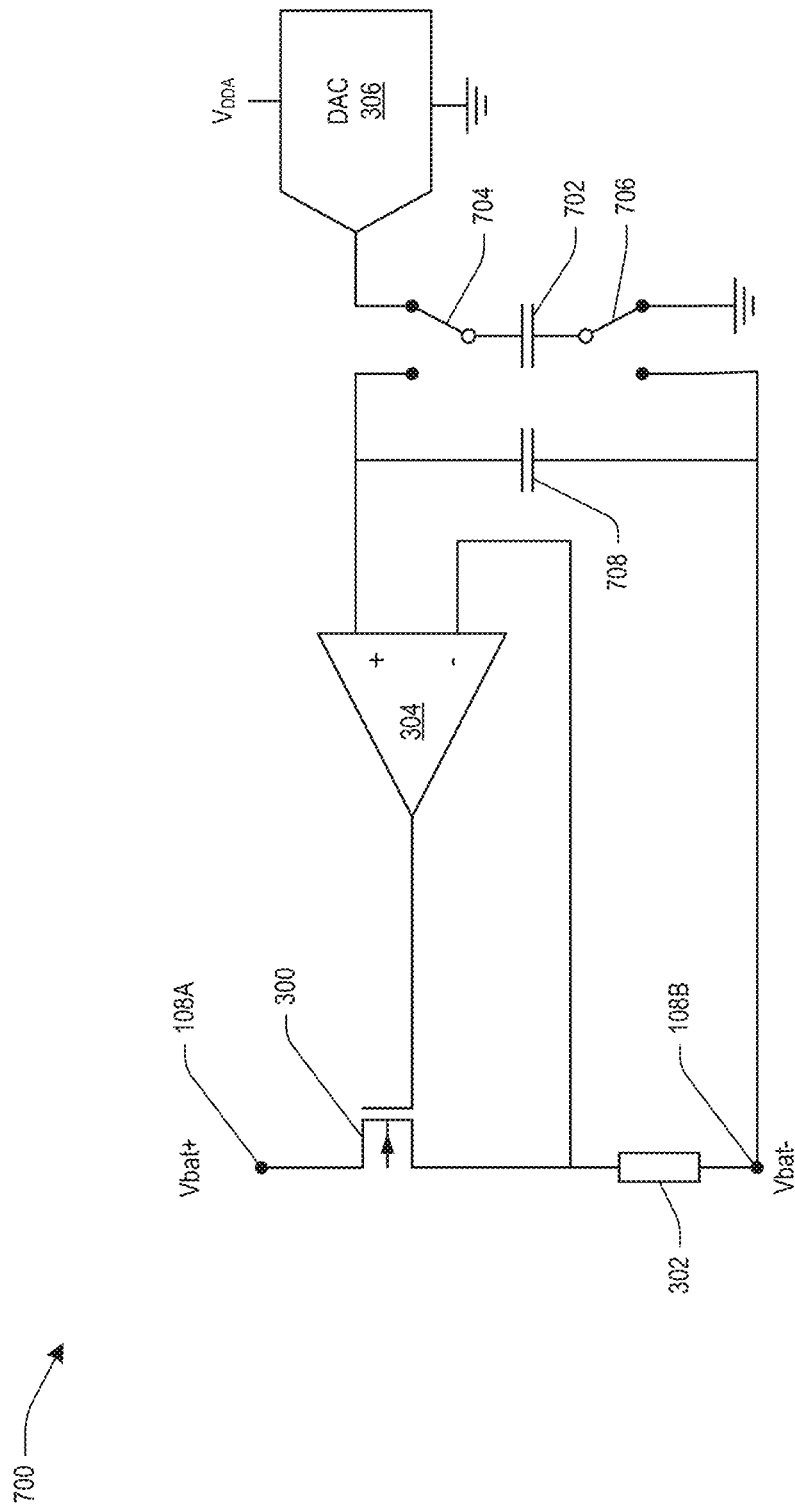
FIG. 8 is a diagram of a battery management unit employing a switched capacitor level shifter to generate an excitation signal, in accordance with some embodiments.

FIG. 8 is a diagram of a battery management unit 800 employing a switched capacitor level shifter to generate an excitation signal, in accordance with some embodiments. In some embodiments, the battery management unit 800 is used with the circuit 700 of FIG. 7 for a battery 102 including multiple cells 102A, 102B, 102C. A sampling capacitor 702 is connected to the DAC 306 by a switch 704 and to ground by a switch 706. A hold capacitor 708 is connected to the switches 704, 706. The switches 704, 706 selectively connect the sampling capacitor 702 to the DAC 306 or to the hold capacitor 708. The sampling capacitor 702 stores the output of the DAC 306 and when the switches 704, 706 connect the sampling capacitor 702 to the DAC 306, and the sampling capacitor 702 transmits the voltage of the DAC 306 to the hold capacitor 708 when the switches 704, 706 connect the sampling capacitor 702 to the hold capacitor 708. The hold capacitor 708 is connected to the non-inverting input of the operational amplifier 304. The shunt resistor 302 is connected between the inverting terminal of the operational amplifier 304 and the second battery terminal 108B and the node of the Rsh resistor which is connected to the negative terminal of the measured cell. As a result, the DAC operates under LV supply. The DAC 306 is operated using a low voltage supply $V_{DDA}$.

Figure 9:
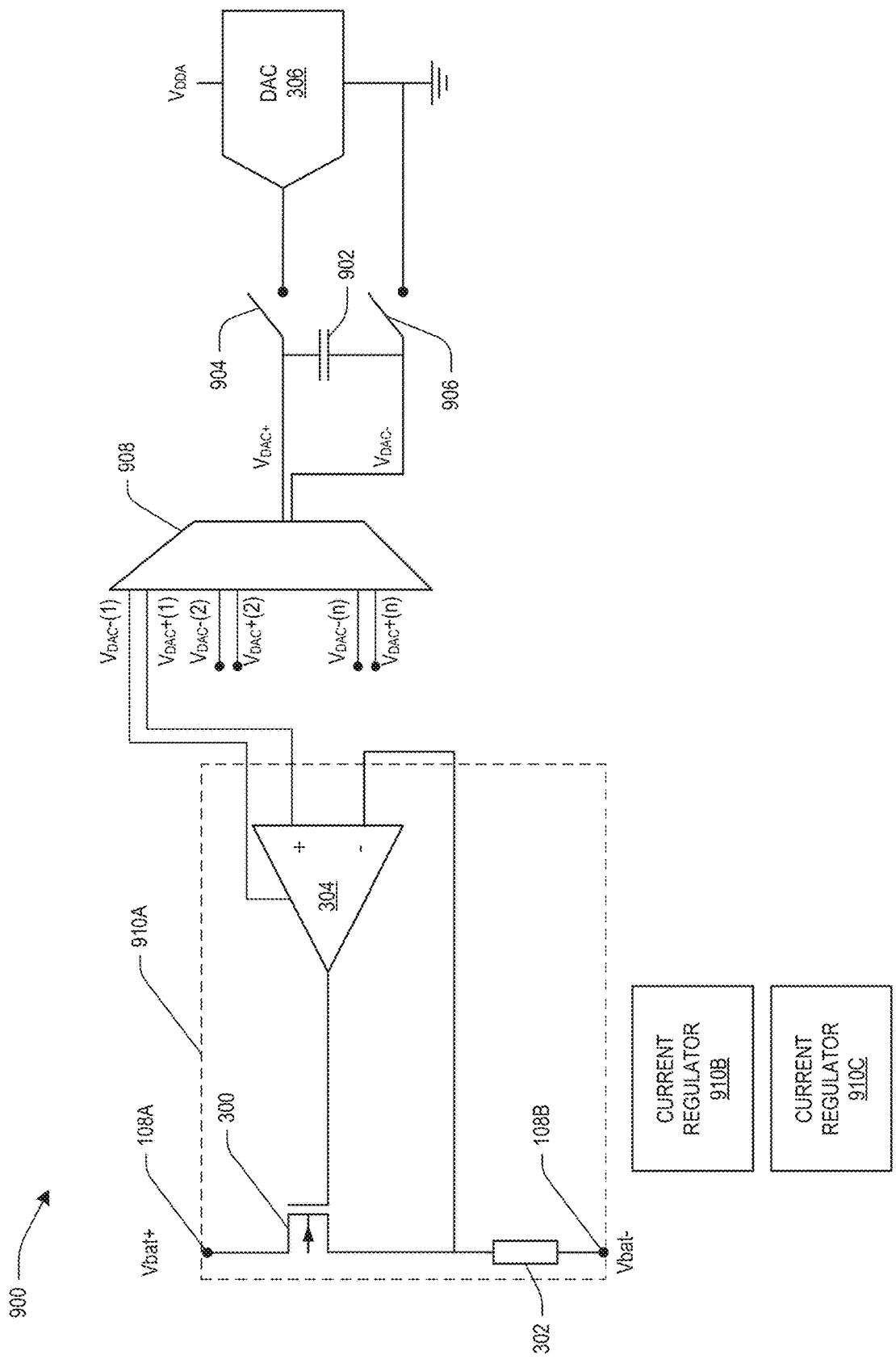
FIG. 9 is a diagram of a battery management unit employing a switched capacitor level shifter with a shared digital to analog converter to generate excitation signals, for multiple battery cells, in accordance with some embodiments.

FIG. 9 is a diagram of a battery management unit 900 employing a switched capacitor level shifter with a shared DAC 306 to generate excitation signals, for multiple battery cells 102A, 102B, 102C, in accordance with some embodiments. The battery management unit 900 comprises a sampling capacitor 902 connected to the DAC 306 by switches 904, 906. The positive voltage signal from the DAC 306, $V_{DAC+}$, and the negative voltage signal from the DAC 306, $V_{DAC-}$, are connected to a multiplexer 908. The multiplexer 908 selectively connects the signals from the DAC 306 to current regulator circuits 910A, 910B, 910C for each of the cells 102A, 102B, 102C. In some embodiments, the multiplexer 908 is controlled to sequentially connect the DAC 306 to a selected current regulator circuit 910A, 910B, 910C to generate an excitation signal for battery impedance measurement. The circuit 100 may be duplicated for each cell 102A, 102B, 102C. In some embodiments, the multiplexer 908 is implemented using switches controlled to implement the multiplexing function.

Figure 10:
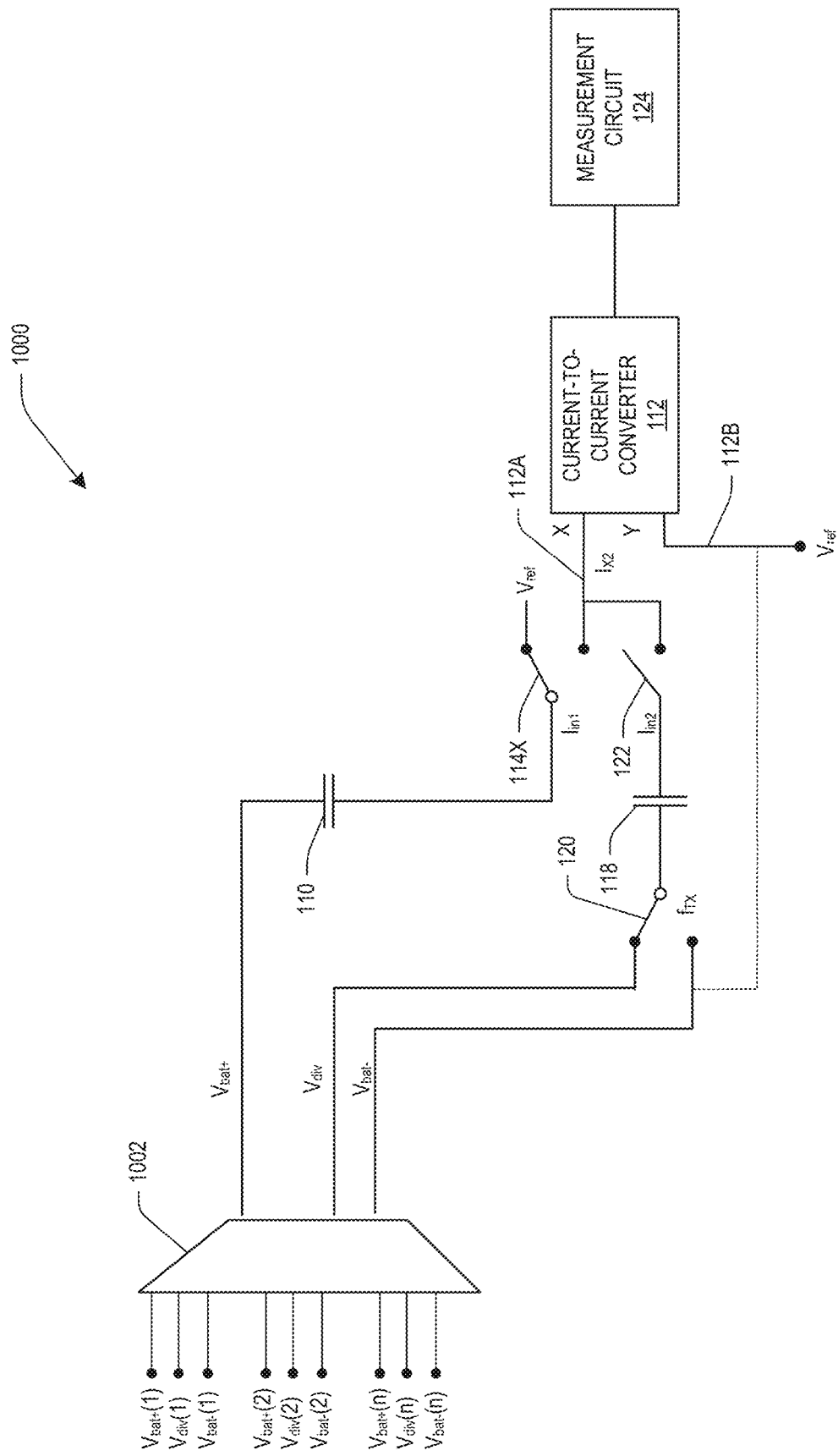
FIGS. 10-12 are diagrams of circuits for measuring battery impedance that are shared across multiple battery cells, in accordance with some embodiments.

FIG. 10 is a diagram of a circuit 1000 for measuring battery impedance that is shared across multiple battery cells, in accordance with some embodiments. The circuit 1000 is connected to a multiplexer 1002 that connects a positive battery terminal, $V_{bat+}(1 \ldots n)$, a voltage divider terminal, $V_{div}(1 \ldots n)$, and a negative battery terminal, $V_{bat-}(1 \ldots n)$, from a selected one of the cells 102A, 102B, 102C to the circuit 1000. In some embodiments, the multiplexer 1002 is implemented using switches controlled to implement the multiplexing function. The circuit 1000 may be shared to allow separate measurement of the battery impedance for each cell 102A, 102B, 102C without duplication of the circuit 1000. In some embodiments, the second sampling capacitor 118 is connected directly to the positive battery terminal, $V_{bat+}(1 \ldots n)$ without a voltage divider 116 and the voltage divider terminal, $V_{div}(1 \ldots n)$, is omitted. In some embodiments, the shared DAC 306 for generating an excitation signal shown in FIG. 9 may be combined with the shared circuit 1000 of FIG. 10.

Figure 11:
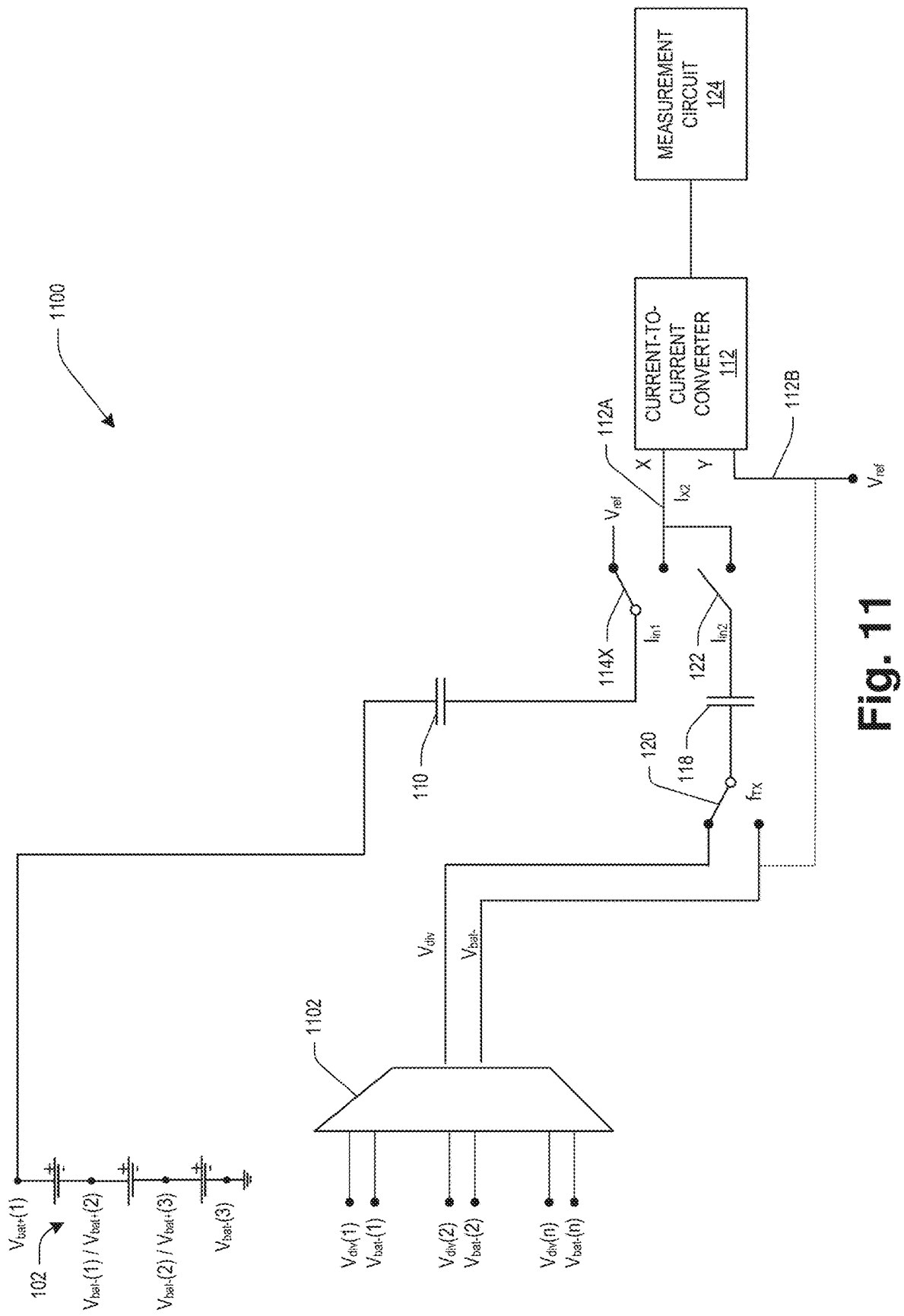

FIG. 11 is a diagram of a circuit 1100 for measuring battery impedance that is shared across multiple battery cells 102A, 102B, 102C in accordance with some embodiments. During the multiplexed measurement of battery impedance, only one cell 102A, 102B, 102C is excited by the loading current and voltage ripple appears on this cell 102A, 102B, 102C. The other cells are not excited and their voltages are relatively constant. As a result, the ripple of the excited cell appears on the top cell 102A relative to ground. If the reference ground voltage is constant relative to the bottom cell 102C in the stack it is possible to connect the first sampling capacitor 110 to the positive battery terminal $V_{bat+}(1)$ of the top cell 102A instead of multiplexing to the positive battery terminal, $V_{bat+}(1 \ldots n)$ of the measured cell. A multiplexer 1102 connects a voltage divider terminal, $V_{div}(1 \ldots n)$, and a negative battery terminal, $V_{bat-}(1 \ldots n)$, from a selected one of the cells 102A, 102B, 102C to the circuit 1100. In some embodiments, the multiplexer 1102 is implemented using switches controlled to implement the multiplexing function. The circuit 1100 may be shared to allow separate measurement of the battery impedance for each cell 102A, 102B, 102C without duplication of the circuit 1100. In some embodiments, the second sampling capacitor 118 is connected directly to the positive battery terminal, $V_{bat+}(1 \ldots n)$ without a voltage divider 116 and the voltage divider terminal, $V_{div}(1 \ldots n)$, is omitted. In some embodiments, the shared DAC 306 for generating an excitation signal shown in FIG. 9 may be combined with the shared circuit 1100 of FIG. 11.

Figure 12:
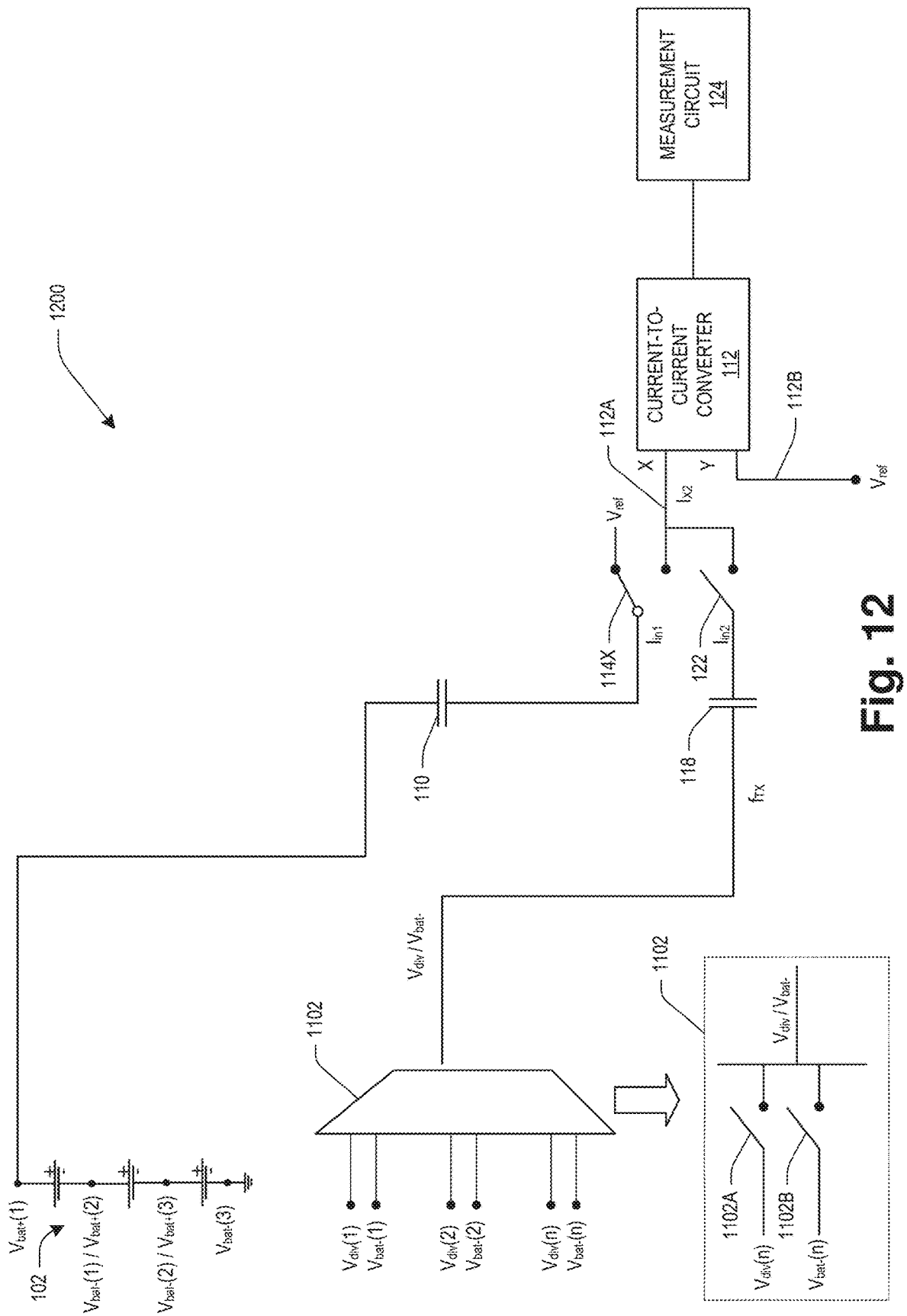

FIG. 12 is a diagram of a circuit 1200 for measuring battery impedance that is shared across multiple battery cells 102A, 102B, 102C in accordance with some embodiments. The Y-input of the current-to-current convertor 112 connection to $V_{bat-}$ output of the multiplexer 1102 is provided in the charge transfer measurement mode if the common voltage of the negative terminal, $V_{bat-}(1 \ldots n)$, of the measured cell varies. In the sequential (multiplexed) measurement of the cell 102A, 102B, 102C impedance, the voltage ripple appears only in the measured cell 102A, 102B, 102C and voltage of other cells 102A, 102B, 102C varies slowly outside the pass-band of the impedance measurements. In this case, the Y-input of the current-to-current convertor to $V_{bat-}$ and the switch 120 may be omitted. The multiplexer 1102 includes switches 1102A, 1102B that selectively connect either the voltage divider signal, $V_{div}(1 \ldots n)$, or the negative battery terminal, $V_{bat-}(1 \ldots n)$, to the second sampling capacitor 118. The switches 1102A, 1102B are toggled to generate the excitation signal for the second sampling capacitor 118.

Figure 13:
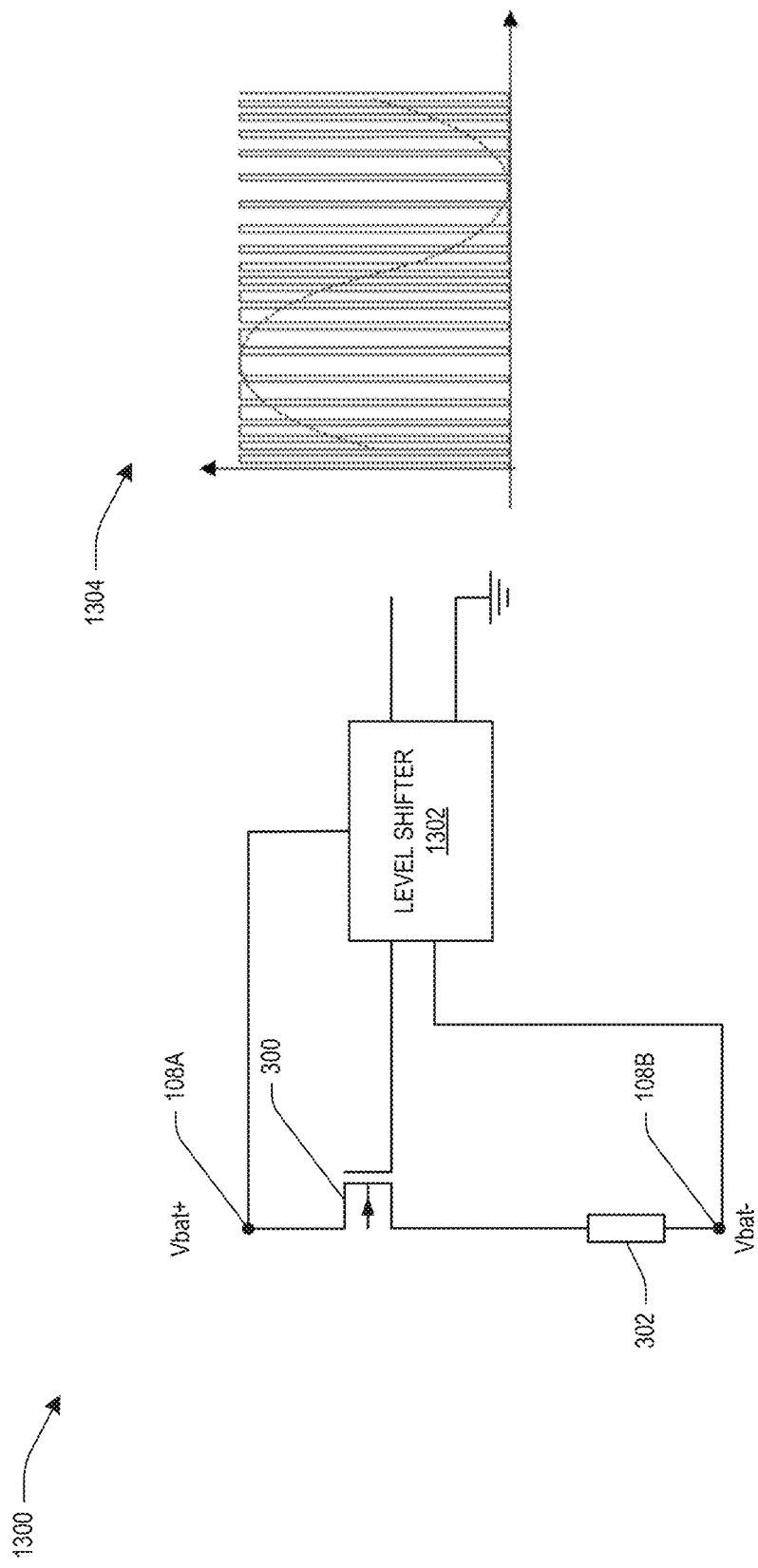
FIG. 13 is a diagram of a battery management unit, in accordance with some embodiments.

FIG. 13 is a diagram of a battery management unit 1300, in accordance with some embodiments. The battery management unit 1300 comprises a level shifter 1302 connected to the transistor 300 for generating the excitation signal. The level shifter 1302 is controlled using a pulse density modulated (PDM) signal, such as the pulse width modulated (PDM) signal illustrated in the waveform 1304. The battery management unit 1300 provides a simplified current regulator by substituting the level shifter 1302 for a DAC. The PDM/PWM binary sequence has an average value that reflects the desired excitation signal. The PDM/PWM binary sequence is applied to the gate of the transistor 300 through the level shifter 1302. The transistor 300 operates in a switch mode if its impedance is much lower than the resistance of shunt resistor 302 or in the common-drain (source-follower) mode in all cases if the output pulses of the level shifter 1302 are constant amplitude.

Figure 14:
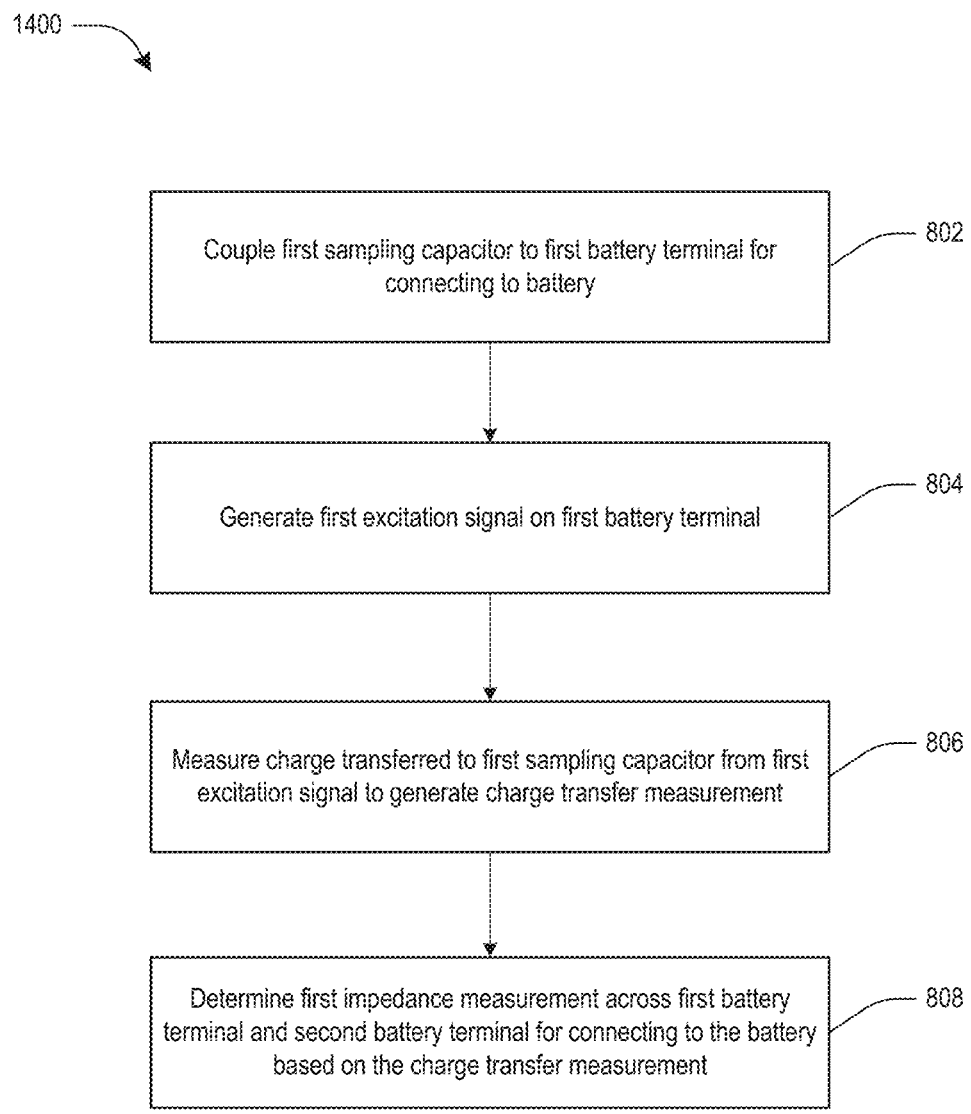
FIG. 14 is a diagram illustrating a method for measuring impedance of a battery, in accordance with some embodiments.

Referring to FIG. 14, a diagram illustrating a method 1400 for measuring impedance of a battery is provided, in accordance with some embodiments. At 1402, a first sampling capacitor 110 is connected to a first battery terminal 108A for connecting to a battery 102. At 1404, a first excitation signal is generated on the first battery terminal 108A. At 1406, charge transferred to the first sampling capacitor 110 from the first excitation signal is measured to generate a charge transfer measurement. At 1408, a first impedance measurement across the first battery terminal and a second battery terminal of the battery is determined based on the charge transfer measurement.

Figure 15:
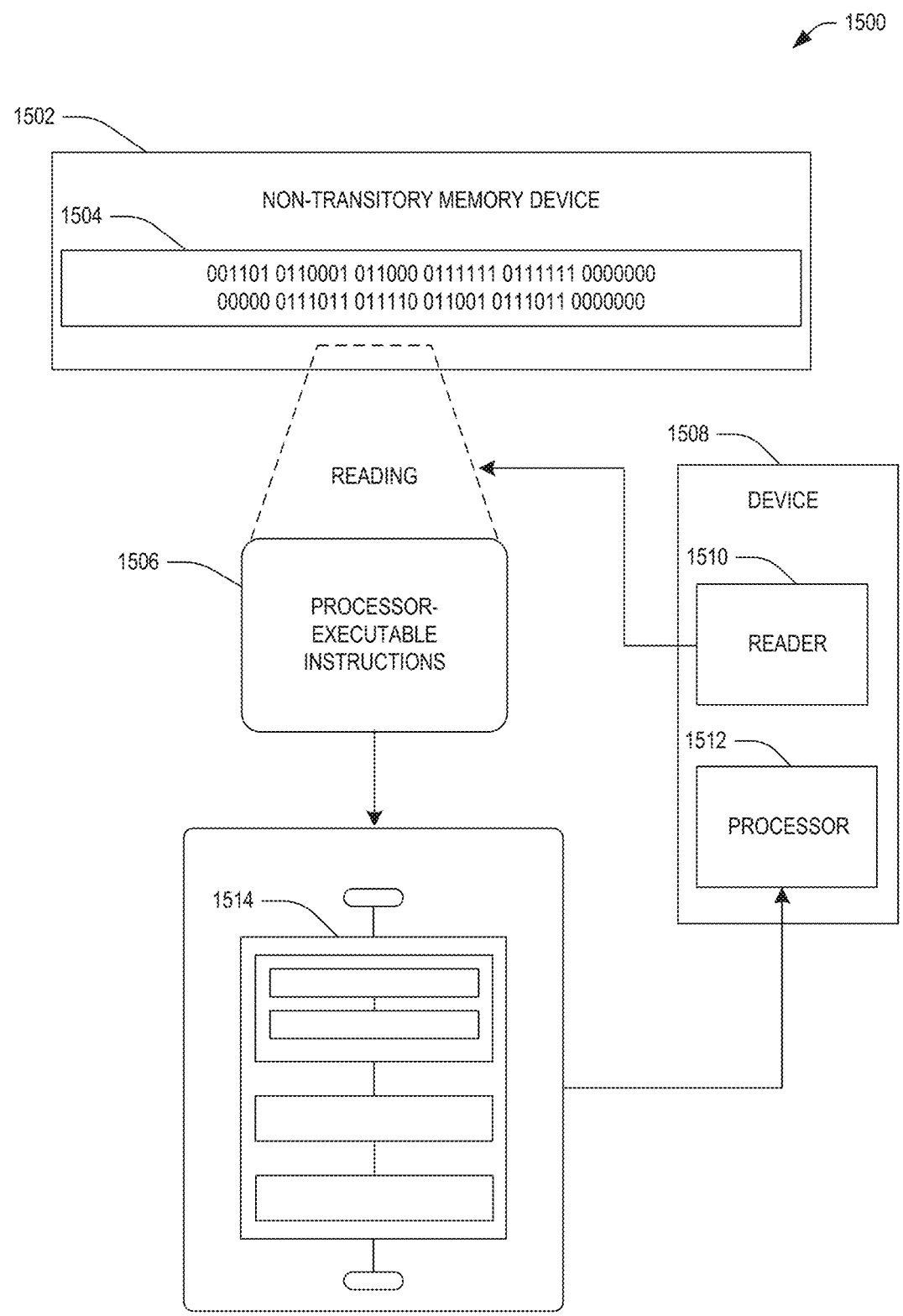
FIG. 15 illustrates an exemplary embodiment of a computer-readable medium, in accordance with some embodiments.

FIG. 15 illustrates an exemplary embodiment 1500 of a computer-readable medium 1502, in accordance with some embodiments. One or more embodiments involve a computer-readable medium comprising processor-executable instructions configured to implement one or more of the techniques presented herein. The embodiment 1500 comprises a non-transitory computer-readable medium 1502 (e.g., a CD-R, DVD-R, flash drive, a platter of a hard disk drive, etc.), on which is encoded computer-readable data 1504. This computer-readable data 1504 in turn comprises a set of processor-executable computer instructions 1506 that, when executed by a computing device 1508 including a reader 1510 for reading the processor-executable computer instructions 1506 and a processor 1512 for executing the processor-executable computer instructions 1506, are configured to facilitate operations according to one or more of the principles set forth herein. In some embodiments, the processor-executable computer instructions 1506, when executed, are configured to facilitate performance of a method 1514, such as at least some of the aforementioned method(s). In some embodiments, the processor-executable computer instructions 1506, when executed, are configured to facilitate implementation of a system, such as at least some of the one or more aforementioned system(s). Many such computer-readable media may be devised by those of ordinary skill in the art that are configured to operate in accordance with the techniques presented herein.

The term "computer readable media" may include communication media. Communication media typically embodies computer readable instructions or other data in a "modulated data signal" such as a carrier wafer or other transport mechanism and includes any information delivery media. The term "modulated data signal" may include a signal that has one or more of its characteristics set or changed in such a manner as to encode information in the signal.

Measuring battery impedance allows the controller 126 to monitor battery parameters such as remaining charge, estimated time to discharge, age-related degradation, faults conditions, or other health parameters. Providing a circuit that uses a charge transfer mode or a voltage measurement mode allows the circuit to be employed in battery management systems with differing operating frequencies.

An embodiment of the presently disclosed techniques includes a circuit. The circuit includes a first sampling capacitor connected to a first battery terminal for connecting to a battery, an excitation circuit connected to the first battery terminal and configured to generate a first excitation signal, and a measurement circuit connected to the first sampling capacitor and configured to measure charge transferred to the first sampling capacitor by the first excitation signal to generate a charge transfer measurement and to determine a first impedance measurement across the first battery terminal and a second battery terminal for connecting to the battery based on the charge transfer measurement.

In an embodiment of the techniques presented herein, the measurement circuit is configured to measure a first amount of the charge transferred to the first sampling capacitor during a first interval of the first excitation signal to generate a first component of the charge transfer measurement, measure a second amount of the charge transferred to the first sampling capacitor during a second interval of the first excitation signal 90° out of phase with the first interval to generate a second component of the charge transfer measurement, generate a resistive component of the first impedance measurement based on the first component of the charge transfer measurement, and generate a reactive component of the first impedance measurement based on the second component of the charge transfer measurement.

In an embodiment of the techniques presented herein, the circuit comprises a controller, a second sampling capacitor, and a first switch having a first input terminal connected to the first battery terminal, a second input terminal connected to the second battery terminal, and an output terminal connected to the second sampling capacitor, wherein the controller provides a first switching signal to the first switch to toggle the first switch between the first input terminal and the second input terminal to generate a second excitation signal, and the measurement circuit is connected to the second sampling capacitor and configured to measure voltage in the second sampling capacitor resulting from the second excitation signal to generate a voltage measurement and determine a second impedance measurement across the first battery terminal and the second battery terminal based on the voltage measurement.

In an embodiment of the techniques presented herein, the measurement circuit is configured to measure a first amount of the voltage in the second sampling capacitor using a first sampling signal in phase with the second excitation signal to generate a first component of the voltage measurement, measure a second amount of the voltage in the second sampling capacitor using a second sampling signal 90° out of phase with the second excitation signal to generate a second component of the voltage measurement, generate a resistive component of the second impedance measurement based on the first component of the voltage measurement, and generate a reactive component of the first impedance measurement based on the second component of the voltage measurement.

In an embodiment of the techniques presented herein, the controller is configured to connect the first sampling capacitor to the measurement circuit responsive to a load frequency being greater than or equal to a first value and to connect the second sampling capacitor to the measurement circuit responsive to the load frequency being less than the first value.

In an embodiment of the techniques presented herein, the measurement circuit comprises a current-to-current converter connected to the first sampling capacitor, a first integrator connected to the current-to-current converter and enabled during a first interval of a first sampling signal, and a second integrator connected to the current-to-current converter and enabled during a second interval of the first sampling signal 90° out of phase with the first interval.

In an embodiment of the techniques presented herein, the circuit comprises a balancing capacitor, and switch controlled by the first sampling signal and having an input terminal connected to the balancing capacitor, a first output terminal connected to the first integrator, and a second output terminal connected to the second integrator.

In an embodiment of the techniques presented herein, the circuit comprises a multiplexer having a first input terminal connected to the first battery terminal, a second input terminal connected to a third battery terminal of the battery, and an output terminal connected to the first sampling capacitor.

In an embodiment of the techniques presented herein, the circuit comprises a multiplexer having an input terminal connected to the excitation circuit, a first output terminal connected to the first battery terminal, and a second output terminal connected to a third battery terminal of the battery.

An embodiment of the presently disclosed techniques includes an apparatus. The apparatus includes means for connecting a first sampling capacitor to a first battery terminal for connecting to a battery, means for generating a first excitation signal on the first battery terminal, means for measuring charge transferred to the first sampling capacitor from the first excitation signal to generate a charge transfer measurement, and means for determining a first impedance measurement across the first battery terminal and a second battery terminal for connecting to the battery based on the charge transfer measurement.

An embodiment of the presently disclosed techniques includes a method. The method includes connecting a first sampling capacitor to a first battery terminal for connecting to a battery, generating a first excitation signal on the first battery terminal, measuring charge transferred to the first sampling capacitor from the first excitation signal to generate a charge transfer measurement, and determining a first impedance measurement across the first battery terminal and a second battery terminal for connecting to the battery based on the charge transfer measurement.

In an embodiment of the techniques presented herein, measuring the charge transferred to the first sampling capacitor comprises measuring a first amount of the charge transferred to the first sampling capacitor during a first interval of the first excitation signal to generate a first component of the charge transfer measurement, measuring a second amount of the charge transferred to the first sampling capacitor during a second interval of the first excitation signal 90° out of phase with the first interval to generate a second component of the charge transfer measurement, generating a resistive component of the first impedance measurement based on the first component of the charge transfer measurement, and generating a reactive component of the first impedance measurement based on the second component of the charge transfer measurement.

In an embodiment of the techniques presented herein, measuring the first amount of the charge transferred to the first sampling capacitor during the first interval of the first excitation signal comprises connecting a first integrator to the first sampling capacitor, and measuring the second amount of the charge transferred to the first sampling capacitor during a second interval of the first excitation signal comprises connecting a second integrator to the first sampling capacitor.

In an embodiment of the techniques presented herein, the method comprises connecting the second integrator to a balancing capacitor during the first interval of the first excitation signal, and connecting the first integrator to the balancing capacitor during the second interval of the first excitation signal.

In an embodiment of the techniques presented herein, the method comprises selectively connecting a second sampling capacitor to the first battery terminal and the second battery terminal to generate a second excitation signal, measuring voltage in the second sampling capacitor resulting from the second excitation signal to generate a voltage measurement, and determining a second impedance measurement across the first battery terminal and the second battery terminal based on the voltage measurement.

In an embodiment of the techniques presented herein, measuring voltage in the second sampling capacitor resulting from the second excitation signal comprises measuring a first amount of the voltage in the second sampling capacitor using a first sampling signal in phase with the second excitation signal to generate a first component of the voltage measurement, measuring a second amount of the voltage in the second sampling capacitor using a second sampling signal 90° out of phase with the second excitation signal to generate a second component of the voltage measurement, generating a resistive component of the second impedance measurement based on the first component of the voltage measurement, and generating a reactive component of the first impedance measurement based on the second component of the voltage measurement.

In an embodiment of the techniques presented herein, the method comprises using the first sampling capacitor to generate the first impedance measurement responsive to a load frequency being greater than or equal to a first value, and using the second sampling capacitor to generate the second impedance measurement responsive to the load frequency being less than the first value.

An embodiment of the presently disclosed techniques includes a circuit. The circuit includes a first sampling capacitor, a second sampling capacitor, a measurement circuit, switch circuitry connecting the measurement circuit to the first sampling capacitor responsive to a load frequency being greater than a first value and connecting the measurement circuit to the second sampling capacitor responsive to the load frequency being less than the first value, and multiplexing circuitry selectively connecting one of the first sampling capacitor or the second sampling capacitor to one of a first battery terminal for connecting to a first cell of a battery or a second battery terminal for connecting to a second cell of the battery, wherein the measurement circuit is configured to measure an impedance across the one of the first battery terminal or the second battery terminal selected by the multiplexing circuitry and a reference battery terminal.

In an embodiment of the techniques presented herein, the measurement circuit is configured to measure a first amount of charge transferred to the first sampling capacitor during a first interval of a first excitation signal to generate a first component of a charge transfer measurement, measure a second amount of charge transferred to the first sampling capacitor during a second interval of the first excitation signal 90° out of phase with the first interval to generate a second component of the charge transfer measurement, generate a resistive component of the impedance based on the first component of the charge transfer measurement, and generate a reactive component of the impedance measurement based on the second component of the charge transfer measurement.

In an embodiment of the techniques presented herein, the measurement circuit is configured to measure a first amount of a voltage in the second sampling capacitor using a first sampling signal in phase with a second excitation signal to generate a first component of a voltage measurement, measure a second amount of the voltage in the second sampling capacitor using a second sampling signal 90° out of phase with the second excitation signal to generate a second component of the voltage measurement, generate a resistive component of the impedance based on the first component of the voltage measurement, and generate a reactive component of the impedance based on the second component of the voltage measurement.

In an embodiment of the techniques presented herein, the measurement circuit comprises a current-to-current converter connected to the switch circuitry, a first integrator connected to the current-to-current converter and enabled during a first interval of a first sampling signal, and a second integrator connected to the current-to-current converter and enabled during a second interval of the first sampling signal 90° out of phase with the first interval.

Various operations of embodiments are provided herein. In one embodiment, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A circuit, comprising:
a controller;
a first sampling capacitor connected to a first battery terminal for connecting to a battery;
an excitation circuit connected to the first battery terminal and configured to generate a first excitation signal;
a measurement circuit connected to the first sampling capacitor and configured to measure charge transferred to the first sampling capacitor by the first excitation signal to generate a charge transfer measurement and to determine a first impedance measurement across the first battery terminal and a second battery terminal for connecting to the battery based on the charge transfer measurement;
a second sampling capacitor; and
a first switch having a first input terminal connected to the first battery terminal, a second input terminal connected to the second battery terminal, and an output terminal connected to the second sampling capacitor, wherein:
the controller provides a first switching signal to the first switch to toggle the first switch between the first input terminal and the second input terminal to generate a second excitation signal; and
the measurement circuit is connected to the second sampling capacitor and configured to measure voltage in the second sampling capacitor resulting from the second excitation signal to generate a voltage measurement and determine a second impedance measurement across the first battery terminal and the second battery terminal based on the voltage measurement.

2. The circuit of claim 1, wherein:
the measurement circuit is configured to:
measure a first amount of the charge transferred to the first sampling capacitor during a first interval of the first excitation signal to generate a first component of the charge transfer measurement;
measure a second amount of the charge transferred to the first sampling capacitor during a second interval of the first excitation signal 90° out of phase with the first interval to generate a second component of the charge transfer measurement;
generate a resistive component of the first impedance measurement based on the first component of the charge transfer measurement; and
generate a reactive component of the first impedance measurement based on the second component of the charge transfer measurement.

3. The circuit of claim 1, wherein:
the measurement circuit is configured to:
measure a first aspect of the voltage in the second sampling capacitor using a first sampling signal in phase with the second excitation signal to generate a first component of the voltage measurement;
measure a second aspect of the voltage in the second sampling capacitor using a second sampling signal 90° out of phase with the second excitation signal to generate a second component of the voltage measurement;
generate a resistive component of the second impedance measurement based on the first component of the voltage measurement; and
generate a reactive component of the first impedance measurement based on the second component of the voltage measurement.

4. The circuit of claim 1, wherein:
the controller is configured to connect the first sampling capacitor to the measurement circuit responsive to a load frequency being greater than or equal to a first value and to connect the second sampling capacitor to the measurement circuit responsive to the load frequency being less than the first value.

5. The circuit of claim 1, wherein the measurement circuit comprises:
a current-to-current converter connected to the first sampling capacitor;
a first integrator connected to the current-to-current converter and enabled during a first interval of a first sampling signal; and a second integrator connected to the current-to-current converter and enabled during a second interval of the first sampling signal 90° out of phase with the first interval.

6. The circuit of claim 5, comprising:
a balancing capacitor; and
a switch controlled by the first sampling signal and having an input terminal connected to the balancing capacitor, a first output terminal connected to the first integrator, and a second output terminal connected to the second integrator.

7. The circuit of claim 1, comprising:
a multiplexer having a first input terminal connected to the first battery terminal, a second input terminal connected to a third battery terminal of the battery, and an output terminal connected to the first sampling capacitor.

8. The circuit of claim 1, comprising:
a multiplexer having an input terminal connected to the excitation circuit, a first output terminal connected to the first battery terminal, and a second output terminal connected to a third battery terminal of the battery.

9. A method, comprising:
connecting a first sampling capacitor to a first battery terminal for connecting to a battery;
generating a first excitation signal on the first battery terminal;
measuring charge transferred to the first sampling capacitor from the first excitation signal to generate a charge transfer measurement;
determining a first impedance measurement across the first battery terminal and a second battery terminal for connecting to the battery based on the charge transfer measurement;
selectively connecting a second sampling capacitor to the first battery terminal and the second battery terminal to generate a second excitation signal;
measuring voltage in the second sampling capacitor resulting from the second excitation signal to generate a voltage measurement; and
determining a second impedance measurement across the first battery terminal and the second battery terminal based on the voltage measurement.

10. The method of claim 9, wherein measuring the charge transferred to the first sampling capacitor comprises:
measuring a first aspect of the charge transferred to the first sampling capacitor during a first interval of the first excitation signal to generate a first component of the charge transfer measurement;
measuring a second aspect of the charge transferred to the first sampling capacitor during a second interval of the first excitation signal 90° out of phase with the first interval to generate a second component of the charge transfer measurement;
generating a resistive component of the first impedance measurement based on the first component of the charge transfer measurement; and
generating a reactive component of the first impedance measurement based on the second component of the charge transfer measurement.

11. The method of claim 10, wherein:
measuring the first aspect of the charge transferred to the first sampling capacitor during the first interval of the first excitation signal comprises connecting a first integrator to the first sampling capacitor; and
measuring the second aspect of the charge transferred to the first sampling capacitor during a second interval of the first excitation signal comprises connecting a second integrator to the first sampling capacitor.

12. The method of claim 11, comprising:
connecting the second integrator to a balancing capacitor during the first interval of the first excitation signal; and
connecting the first integrator to the balancing capacitor during the second interval of the first excitation signal.

13. The method of claim 9, wherein measuring voltage in the second sampling capacitor resulting from the second excitation signal comprises:
measuring a first aspect of the voltage in the second sampling capacitor using a first sampling signal in phase with the second excitation signal to generate a first component of the voltage measurement;
measuring a second aspect of the voltage in the second sampling capacitor using a second sampling signal 90° out of phase with the second excitation signal to generate a second component of the voltage measurement;
generating a resistive component of the second impedance measurement based on the first component of the voltage measurement; and
generating a reactive component of the first impedance measurement based on the second component of the voltage measurement.

14. The method of claim 9, comprising:
using the first sampling capacitor to generate the first impedance measurement responsive to a load frequency being greater than or equal to a first value; and
using the second sampling capacitor to generate the second impedance measurement responsive to the load frequency being less than the first value.

15. A circuit, comprising:
a first sampling capacitor;
a second sampling capacitor;
a measurement circuit;
switch circuitry connecting the measurement circuit to the first sampling capacitor responsive to a load frequency being greater than a first value and connecting the measurement circuit to the second sampling capacitor responsive to the load frequency being less than the first value; and
multiplexing circuitry selectively connecting one of the first sampling capacitor or the second sampling capacitor to one of a first battery terminal for connecting to a first cell of a battery or a second battery terminal for connecting to a second cell of the battery, wherein
the measurement circuit is configured to measure an impedance across the one of the first battery terminal or the second battery terminal selected by the multiplexing circuitry and a reference battery terminal.

16. The circuit of claim 15, wherein:
the measurement circuit is configured to:
measure a first aspect of charge transferred to the first sampling capacitor during a first interval of a first excitation signal to generate a first component of a charge transfer measurement;
measure a second aspect of charge transferred to the first sampling capacitor during a second interval of the first excitation signal 90° out of phase with the first interval to generate a second component of the charge transfer measurement;
generate a resistive component of the impedance based on the first component of the charge transfer measurement; and generate a reactive component of the impedance measurement based on the second component of the charge transfer measurement.

17. The circuit of claim 15, wherein:
the measurement circuit is configured to:
  measure a first aspect of a voltage in the second sampling capacitor using a first sampling signal in phase with a second excitation signal to generate a first component of a voltage measurement;
  measure a second aspect of the voltage in the second sampling capacitor using a second sampling signal 90° out of phase with the second excitation signal to generate a second component of the voltage measurement;
  generate a resistive component of the impedance based on the first component of the voltage measurement; and
  generate a reactive component of the impedance based on the second component of the voltage measurement.

18. The circuit of claim 15, wherein the measurement circuit comprises:
  a current-to-current converter connected to the switch circuitry;
  a first integrator connected to the current-to-current converter and enabled during a first interval of a first sampling signal; and
  a second integrator connected to the current-to-current converter and enabled during a second interval of the first sampling signal 90° out of phase with the first interval.

* * * * *